US012785345B2

(12) United States Patent
Chao et al.

(10) Patent No.: US 12,785,345 B2
(45) Date of Patent: Nov. 3, 2026

(54) POWER SUPPLY CONNECTOR

(71) Applicant: HEWLETT PACKARD ENTERPRISE DEVELOPMENT LP, Spring, TX (US)

(72) Inventors: Hsueh-Yu Chao, Taipei (TW); Chih-Wei Chiang, Taoyuan City (TW); Kuan-Wei Chen, Taipei City (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 318 days.

(21) Appl. No.: 18/772,383

(22) Filed: Jul. 15, 2024

(65) Prior Publication Data

US 2026/0018842 A1 Jan. 15, 2026

(51) Int. Cl.

| | |
|---|---|
| ***H01R 31/06*** | (2006.01) |
| ***G06F 1/18*** | (2026.01) |
| ***H01R 4/48*** | (2006.01) |
| ***H01R 13/05*** | (2006.01) |
| ***H01R 13/502*** | (2006.01) |
| ***H01R 13/652*** | (2006.01) |
| ***H05K 7/14*** | (2006.01) |

(52) U.S. Cl.

CPC ........... *H01R 31/065* (2013.01); *G06F 1/189* (2013.01); *H01R 4/48* (2013.01); *H01R 13/05* (2013.01); *H01R 13/502* (2013.01); *H01R 13/652* (2013.01); *H05K 7/1492* (2013.01)

(58) Field of Classification Search

CPC ........ H01R 31/065; H01R 4/48; H01R 13/05; H01R 13/502; H05K 7/1492

USPC .................................................. 439/638, 108

See application file for complete search history.

(56) References Cited

U.S. PATENT DOCUMENTS

| | | | | |
|---|---|---|---|---|
| 6,888,727 | B2 * | 5/2005 | Chang | G06F 1/184 361/679.48 |
| 10,381,758 | B1 | 8/2019 | Scanlon | |
| 11,460,874 | B1 * | 10/2022 | King | G05F 1/625 |
| 11,804,678 | B2 * | 10/2023 | Zhou | H01R 31/065 |
| 11,855,396 | B2 * | 12/2023 | Yu | G06F 13/4081 |
| 2005/0009404 | A1 * | 1/2005 | Lee | H01R 31/06 439/638 |
| 2013/0273776 | A1 * | 10/2013 | Deng | G09G 3/2096 439/620.01 |
| 2023/0163528 | A1 | 5/2023 | Gieski | |

FOREIGN PATENT DOCUMENTS

| | | |
|---|---|---|
| WO | 2014/134218 A1 | 9/2014 |

* cited by examiner

*Primary Examiner* — Gary F Paumen

(74) *Attorney, Agent, or Firm* — Jones Burke, PLLC

(57) ABSTRACT

A power supply adapter, a system and a method. The power supply adapter comprising a casing, a power supply unit (PSU) connector comprising a socket configured of receive an edge connector of a PSU, an output connector configured to receive a first connector of a power cable and comprising connector pins, wherein the PSU connector comprises a ground conductor assembly housed in the casing and comprising a first plate assembly and a first conductivity clamp comprising a set of ground contacts, a primary conductor assembly housed in the casing and comprising a second plate assembly and a second conductivity clamp.

20 Claims, 13 Drawing Sheets

POWER SUPPLY CONNECTOR

INTRODUCTION

In enterprise information processing systems (e.g., servers), the power supply units (PSUs) of the system often utilize an PCB edge-connector to connect to the primary system board of the system, with the primary system board generally having one or more compatible sockets mounted thereto to receive the edge connectors of such PSUs. For example, computing systems that utilize the Open Compute Project (OCP) form factor generally include PSUs with edge connectors which comply with OCP specifications, with such PSUs generally being referred to as modular common redundant power supplies (M-CRPS) (also referred to herein interchangeably as PSUs). In such computing systems, the Host Processor Module (HPM), which is analogous to a motherboard that follows an OCP form factor, often includes PSU connectors compliant with the OCP modular hardware system, often referred to as CRPS connectors. The M-CRPS are docked to the HPM through the CRPS connectors, which are generally mounted to a rear edge of the HPM, to provide power to the system. As the power requirements of the system increase, such as due to additions of peripherals, more M-CRPS may need to be docked to the HPM to meet that increase power requirement and to ensure redundancy.

For example, as more graphical processing units (GPUs) are added to the system, the power requirements of the system often will increase, thus often requiring the addition of power supply units to the system. Once the number of needed PSUs (e.g., M-CRPS) exceeds the number of PSU sockets (e.g., CRPS connectors) available at the rear of the primary system board or HPM, often the additional PSUs are stacked and connected to the primary system board or HPM through specialized breakout boards, such as a Power Distribution Board (PDB) (e.g., some PSUs are connected to the available PSU sockets of the primary system board and the remainder are connected to PSU sockets on a PDB, which is in turn connected to the primary system board). Often, the PDB comprises a printed circuit board (PCB) with one or more CRPS connectors mounted to a face thereof, so that the PDB can be arranged in a vertical orientation (perpendicular to the HPM) in front of the M-CRPS with the CRPS connectors mated to the M-CRPS.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operation. In the drawings.

Figure 1:
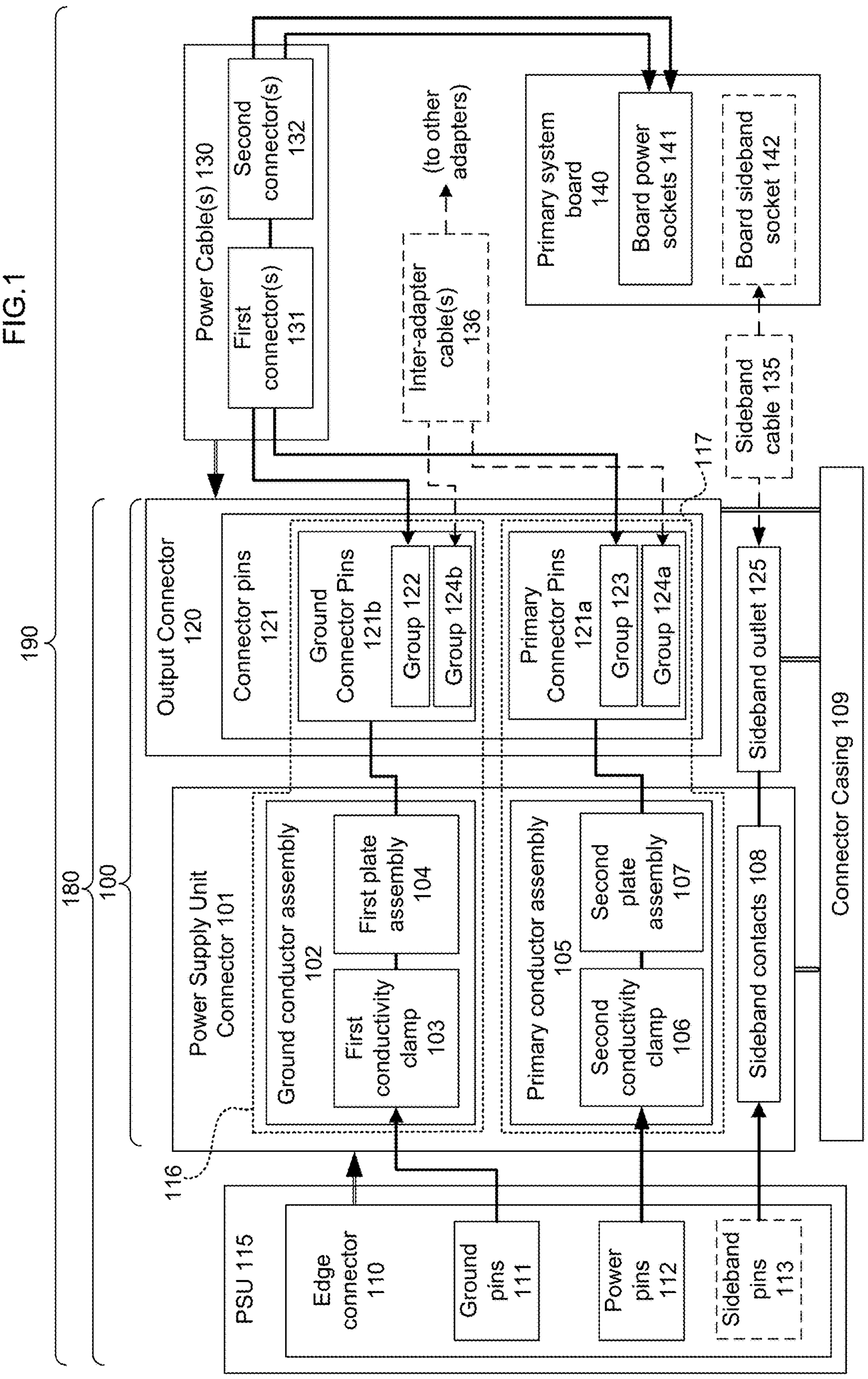
FIG. 1 is a block diagram illustrating an example of an assembly including a power supply edge connector, a power supply connector, an output connector and a power cable.

The drawings are included to provide a further understanding of the present disclosure and are incorporated in and constitute a part of this specification. The drawings illustrate one or more examples of the present teachings and together with the description explain certain principles and operations. In some occasions, details that are not necessary for an understanding of an instance of this disclosure or that render other details difficult to perceive may have been omitted.

DETAILED DESCRIPTION

The use of a PDB enables the use of additional PSUs to meet the power needs of the system. However, the use of a PDB can increase the costs of the system, as PCBs can be costly to develop and produce. In addition, the PDB often restricts airflow to the PSUs, which can decrease the effectiveness of cooling provided to the PSUs. The PDB may restrict airflow through the PSUs because the vertically oriented PDB sits in front of and covers much of the front side of the PSU, which is usually the primary place where air enters the PSU. Although most PDBs include openings to try to mitigate the effects on airflow, the degree of airflow obstruction (impedance) presented by the PDB may still be larger than is desired in some circumstances notwithstanding these openings. Furthermore, often different systems or system configurations may require specific PDBs, which may add to the cost of its use.

For example, one system may have a particular a chassis, a particular primary system board, and a particular arrangement of PSUs, and thus may use a certain type of PDB which is compatible with this configuration, whereas another system may have a different chassis, different primary system board, and/or different PSU arrangement, and thus it may need a different PDB which is compatible with its different configuration.

While it may be possible to increase the cooling capacity of the system or install more efficient cooling, such as liquid-cooling systems, to help remedy the increased temperatures due to the air flow constraints caused by the use of a PDB, this approach increases the cost substantially in terms of the increase in energy needed to increase the cooling or the financial cost of installing and running a liquid-cooling system.

To address the above-mentioned challenges, the disclosure provides compact power supply adapters for connecting power supply units to a primary system board (such as an HPM) without the need for a PDB. These adapters are attached to connectors on the primary system board through flexible wires, thus allowing for multiple configurations of the PSUs, such as side-by-side or stacked configurations.

In examples, the adapter includes multiple connectors which are all integrated together into a single unit or module. In particular, the adapter comprises a PSU connector on one side thereof which mates with the edge connector of a PSU and an output connector on an opposite side thereof which mates with one or more cable connectors of one or more cables (which may be connected to the primary system board or to other adapters). The PSU connector includes a socket to receive the edge connector of the PSU, a ground conductor assembly comprising ground contacts in the socket to engage ground pins of the edge connector for ground connection with the PSU, and a primary conductor assembly comprising primary contacts to engage primary pins of the edge connector for receiving a primary power supply voltage from the PSU. The output connector includes multiple connector pins, some of which are electrically connected to the ground conductor assembly of the PSU connector and others of which are electrically connected to the primary conductor assembly of the PSU connector. The connector pins of the output connector are to engage with pins of a connector of a cable which is mated with the output connector. In some examples, multiple cables can be connected concurrently to the output connector, with different subsets of the connector pins being connected to different cables. These cables may, in turn, be connected to the primary system board or to some other devices, such as another adapter (connected to another PSU), an expansion card, etc. Thus, when a PSU's edge connector is mated with the PSU connector and the cable connector is mated with the output connector, conductive pathways are established between the PSU and whatever device the cable is plugged into (e.g., the primary system board) via the ground and primary conductors, the connector pins, and the cable.

Generally, the adapter is substantially shorter (has a smaller vertical dimension) than a PDB and does not protrude nearly as far over the front side of the PSU, and therefore the adapter does not impede airflow to the same extent that many PDBs would, thus allowing for better cooling of the PSUs. The short profile of the adapter may be enabled in part because the adapter does not have a PCB which would extend vertically to cover the PSU. The short profile may also be enabled by the ground and primary conductors of the PSU connector being directly connected to the connector pins of the output connector, which allows the PSU connector and output connector to be positioned at similar heights (i.e., overlapping one another horizontally), reducing the overall height of the adapter (in contrast to PDBs, where connectors on opposite sides of the PCB often need to be positioned at different heights to allow room for the connector mounting through-holes in the PCB). The adapter is also substantially less costly than many PDBs, as a major cost of such PDBs is the PCB design and development, which can be omitted in the adapter. Moreover, the adapter can, in some instances, be formed through relatively easy and cost-effective manufacturing techniques, such by stamping (e.g., for the ground and primary conductors), over-molding (e.g., for the casing), and press-fitting (e.g., for engaging connector pins with the ground and primary conductors).

In some examples, the ground conductor assembly of the PSU connector may include a first vertical plate that contacts one or more of the connector pins of the output connector and a first conductivity clamp comprising a set of the ground contacts. The first clamp comprises two rows of horizontally extending ground contacts which are arranged so that the edge connector is received therebetween when inserted in the PSU connector, with the ground contacts contacting corresponding ground pins in the edge connector. Moreover, the ground contacts are configured as spring fingers which are moved by the edge connector during insertion and, in response, generate restoring spring forces which hold the ground contacts against the ground pins, thus effectively clamping the edge connector between the ground contacts and ensuring a good low-resistance electrical connection. The first clamp is directly electrically connected to the first vertical plate. For example, in some instances the first clamp and the first vertical plate are integrally connected, meaning they are part of the same unitary (monolithic) body. For example, the first clamp and first vertical plate may be formed from the same piece of sheet metal, e.g., by sheet metal stamping.

The primary conductor assembly may include a second vertical plate that contacts one or more other connector pins of the output connector and a second conductivity clamp comprising a set of primary contacts. The second clamp and the primary contacts thereof may be similar to the first clamp and ground contacts described above, except that the primary contacts are arranged to contact primary pins of the edge connector.

The adapter also comprises a casing which supports and integrates together the other portions of the adapter. In some examples, the casing may form the socket of the PSU connector and houses the ground and primary conductor assemblies. The casing is also coupled to, and in some cases may fully or partially house, the output connector. In some examples, the output connector is formed separately from the casing and is then connected to the casing, for example by being inserted into a receptacle in the casing.

In some examples, the output connector may comprise multiple housings grouped together, which each housing containing a subset of the connector pins. For example, the output connector may be formed from multiple smaller connectors which are grouped together. In some examples, the output connector, or the smaller connectors which together make up the output connector, may have a form factor of a commercially available power connector. In some examples, the connector pins of the output connector are pressed into the first and second vertical plates of the ground and primary conductors, respectively, to establish the electrical connection therebetween.

In some instances, the PSU connector further comprises sideband contacts in the socket and arranged to contact sideband pins of the edge connector received in the socket. The adapter may also comprise, in some examples, a sideband connector which includes pins electrically connected to the sideband contacts. This sideband connector is configured to mate with a connector of a sideband cable, which may be connected to the primary system board. Thus, the PSU may be communicably connected to the primary system board to communicate sideband signals therebetween via the sideband contacts, sideband connector, and sideband cable. The sideband connector may be formed integrally into the casing, in some examples, or comprise a separately formed (e.g., commercially available) connector which is mounted to the casing.

As noted above, a cable may include a connector at one end thereof to mate with the output connector, and the cable may include a second connector at the opposite end thereof, with flexible wires extending therebetween. This second connector may be connected to power connectors of another device, thereby electrically connecting the adapter (and the PSU connected thereto) to the other device. For example, one or more cables may connect the adapter to the primary system board (e.g., via aa Platform Connectivity Power (PICPWR) distribution connector of the system board), with such cables being referred to herein as "power cables." As another examples, one or more cables may be used to connect one adapter to another adapter, with these being referred to as inter-adapter cables. As another example, one or more cables may be used to connect one adapter an expansion card or other device, and these cables may be referred to as auxiliary cables. In examples in which multiple cables are coupled to the same adapter, the cables may be coupled to different subsets of the connector pins of the output connector.

As noted above, inter-adapter cables may be used where two or more power supply adapters are coupled to one another. This may be done in order to provide power redundancy to the system and/or to reduce the number of power cables which need to connect to the system board. More specifically, the inter-adapter cables electrically connect the adapters to one another, essentially forming a shared power plane which can be connected to the system board using fewer system board power connectors than may be needed if each adapter were connected directly to the system board. If the PSU connected to one adapter fails, the power supplied by the other PSU connected to the other adapter can still be delivered to the system board via inter-adapter cables, the adapters, and the power cable.

These and other examples will be described in greater detail below in relation to FIGS. 1-9.

Now referring to FIG. 1, a power supply adapter 100 for an edge connector 110 of a power supply unit is presented. The adapter 100 is shown in association with an information processing device 190 including a power cable 130, a primary system board 140, and a PSU 115 for context. FIG. 1 also illustrates an assembly 180 of adapter 100 with the PSU 115 for context. Although the adapter 100, the assembly 180 and the information processing device 190 are described together herein for ease of understanding, it should be understood that the adapter 100, the PSU 115, and/or other components of the information processing device 190 may be produced or sold separately or together and may be claimed separately or together herein—in other words, some examples disclosed herein include the adapter 100 alone, others include the assembly 180, and still others include the entire information processing device 190. In FIG. 1, electrical connections are indicated by solid and dashed lines, whereas physical connection or engagement is indicated by doubled lines (not all connections are necessarily shown). Lines with arrows thereon indicate removable connections.

The adapter 100 includes a power supply unit connector 101, a connector casing 109, an output connector 120 and a sideband outlet 125. The power supply unit connector 101 is configured to receive an edge connector of a PSU, such as edge connector 110 of PSU 115. The output connector 120 is configured to receive the connector(s) of one or more cables, such as power cables 130, inter-adapter cables 136, and/or other cables. The sideband outlet 125 is configured to receive the connector of a sideband cable 135. The connector casing 109 supports and physically connects the other components of the adapter 100 together. In some examples, the connector casing 109 also forms a housing of the power supply unit connector 101, the sideband outlet 125, and/or the output connector 120, and houses the electrical components thereof. In some examples, the power supply unit connector 101 and the output connector 120 are disposed on opposite sides of the connector casing 109.

The power supply unit connector 101 includes a ground conductor assembly 102 housed in casing 109, a primary conductor assembly 105 housed in casing 109 and sideband contacts 108 also housed in casing 109. In instances, the ground conductor assembly 102 includes a first conductivity clamp 103 and a first plate assembly 104 which are electrically connected to one another. The first plate assembly 104 is electrically connected to (in contact with) ground connector pins **121*b* of the output connector 120, which will be described below. The first conductivity clamp 103 includes a set of ground contacts electrically connected to the first plate assembly 104 and configured to engage ground pins 111 of the edge connector 110 and electrically connect the ground pins 111 to the ground conductor assembly 102. When the edge connector 110 is connected to the PSU connector 101, the first conductivity clamp 103 and first plate assembly 104 conduct electricity between the ground pins 111 and the ground connector pins 121*b***.

In some instances, the first conductivity clamp 103 and the first plate assembly 104 may be a monolithic structure. For example, the ground conductor assembly 102 may be formed by forming a single integral piece of sheet metal (e.g., by stamping).

In some instances, first conductivity clamp 103 and the first plate assembly 104 may be separate structures attached to each other, in which case first conductivity clamp 103 and first plate assembly 104 may be attached through fastening, soldering, welding, riveting and the like. In such examples which have separately formed clamp 103 and plate assembly 104, first plate assembly 104 may be made of the same material as the first conductivity clamp 103 or of a different material. For example, first conductivity clamp 103 may be made of low electrical resistance materials, such as metal pieces, that contact the ground pins 111 to create an electric connection.

In some examples, the ground contacts of the first conductivity clamp 103 may be arranged in two groups which are disposed opposite from one another such that, when the edge connector 110 is received in the power supply unit connector 101, the two groups of ground contacts receive the edge connector 110 therebetween and engage opposite sides thereof. In some examples, the edge connector 110 includes two groups of ground pins 111 arranged on these two opposite sides such that the two groups of ground contacts of the clamp 103 engage these groups of ground pins 111. In other examples, some or all ground pins 111 may include portions which are positioned on both opposite sides of the edge connector so that the two groups of ground contacts of the clamp 103 are engaging different portions of the same set of ground pins 111. Further in some examples, first conductivity clamp 103 may be arranged such that the ground contacts are deflected slightly by the edge connector 110 where received therebetween and, in response, to generate restoring spring forces which cause the clamp 103 to press against opposite sides of the edge connector 110 (in contact with the ground pins 111) so as to maintain electrical contact and maintain the edge connector 110 in a connected position, as will be described in further detail below.

In instances, the primary conductor assembly 105 includes a second conductivity clamp 106 and a second plate assembly 107 which are electrically connected to one another. The second plate assembly 107 is electrically connected to (in contact with) primary connector pins 121*a* of the output connector 120, which will be described below. The second conductivity clamp 106 includes a set of primary contacts electrically connected to the second plate assembly 107 and configured to engage primary power pins 112 of the edge connector 110 to electrically connect the second plate assembly 107 to the primary power pins 112. In some examples, primary conductor assembly 105 may comprise two groups of primary contacts arranged opposite one another so as to receive the edge connector 110 therebetween and engage opposite sides thereof. In an example, the second conductivity clamp 106 may also be made of a low electrical resistance material that contacts the top part and the bottom part of the power pins 112 to create an electrical connection. The second conductivity clamp 106 may be made of the same material as the first conductivity clamp 103. In some instances, second conductivity clamp 106 may be made of a different material from the first conductivity clamp 111. In instances, second conductivity clamp 106 may be attached to second plate assembly 107. In instances, second conductivity clamp 106 and second plate assembly 107 are a monolithic structure. In an example, second conductivity clamp 106 and second plate assembly 107 conduct electricity between the power pins 112 and the second group 123 of the connector pins 121.

In instances, the first and second conductivity clamps 103/106 may include tips configured to contact the edge connector 110 and open the conductivity clamps 103/106 in response to the edge connector 110 being inserted into the socket of the power supply unit connector 101. In some instances, the connector pins 121 may be pressed fitted into the first and second plate assemblies 104/107.

In some instances where the edge connector 110 includes sideband pins 113, the sideband contacts 108, included in the power supply unit connector 101, are configured to engage with the sideband pins 113. In instances, the sideband contacts 108 are in contact with, and communicably connected to, pins or other electrical contacts within the sideband outlet 125. In instances, sideband outlet 125 is configured to removably engage the sideband cable 135. In some instances, a first end of sideband cable 135 may be removably mated with sideband outlet 125 while a second end of sideband cable 135 may be removably mated with a sideband socket 142 of primary system board 140.

The output connector 120 is configured to receive one or more first connectors 131 of one or more power cables 130 and includes connector pins 121. Each pin of the connector pins 121 includes a first portion which is in contact with a plate of the first plate assembly 104 or a plate of the second plate assembly 107, and a second portion which is configured to removably engage with a corresponding pin of a connector of a cable mated with the output connector 120. In instances, each pin of the connector pins 121 includes a first portion which is in contact with a plate of the first plate assembly 104 or a plate of the second plate assembly 107, and a second portion which is configured to removably engage with a corresponding pin of a connector of a cable (such as the first connector 131 of the power cable 130) in a mated state of cable's connector with the output connector 120.

The connector pins 121 of the output connector 120 includes ground connector pins 121*b*, which are electrically connected to the ground conductor assembly 102, and primary connector pins 121*a*, which are electrically connected to the primary conductor assembly. The ground conductor assembly 102 and the ground connector pins 121*b* thus together form a common power plane referred to herein as the ground (GND) bus 116 of the adapter 100, which carries the ground potential supplied by the PSU 115 via ground pins 111. Similarly, primary conductor assembly 105 and the primary connector pins 121*a* together form a common power plane referred to herein as the primary bus 117 of the adapter 100, which carries the primary potential supplied by the PSU 115 via power pins 112 (e.g., a 12V potential).

In some examples, the ground connector pins 121*b* include multiple subsets or groups of pins 121*b* which may be connected to different connectors of different cables, and similarly, primary connector pins 121*a* may include multiple subsets or groups of pins 121*a* which may be connected to different connectors of different cables. For example, one group of pins might be connected to a power cable 130 which is plugged into the primary system board 140, while another group of pins might be connected to an inter-adapter cable which connects the adapter 100 to another adapter. In FIG. 1 the groups 122 and 123 represent pins 121 which are connected to primary system board via one or more power cables 130. In addition, the groups 124*a* and 124*b* represent pins 121 which are connected to some other cable(s) (e.g., an inter-adapter cable 136). In some examples, a user may select which connector pins 121 to plug the various cables into, depending on the configuration of the system 190 in which the adapter 100 is being deployed and/or the user's arbitrary choices—in other words, it is not fixed in advance that certain pins must always be connected to certain types of cable and not others. Accordingly, which connectors pins 121 are members of the groups 122, 123, 123*a*, and 124*b* may vary from one deployment to the next based on how the cables are connected, and not all pins 121 necessarily have a connector connected thereto in each deployment.

Note that power cables 130 could be physically separate cables in some examples or in other examples could be physically bundled together to form a single cable assembly. When cables 130 are physically bundled together, they may share some parts in common. For example, the first connectors 131 of the two bundled cables 130 may share a single outer housing in common. As another example, the wires of two bundled cables 130 may share an outer sheathing in common. However, even in cases where the cables 130 are physically bundled together in this way, the cables 130 are still considered as logically separate herein because they form different conductive pathways between different endpoints and/or carry different voltages.

In some examples, the adapter 100 is not connected to any inter-adapter cables 136. In such examples, two power cables 130 may be connected to the adapter 100, with one cable 130 being connected to the ground bus 116 and the other cable 130 being connected to the primary bus 130 (these two cables 130 could be physically separate, or physically bundled together, as noted above). More specifically, the first connector 131 of one power cable 130 is connected to group 122 and the first connector 131 of the other power cable 130 is connected to group 123. In some examples, the groups 122 and 123 may be physically adjacent to one another in the output connector 120, which may enable the first connectors 131 connected thereto to be physically bundled together (e.g., to share the same outer housing in common). Each of the power cables 130 also includes a second connector 132, which is connected to the first connector 131 of the cable 130 by wires. The second connector 132 of each cable 130 is connected to a board power socket 141 of primary system board 140, as described below. This connection arrangement establishes a circuit between the PSU 115 and the primary system board 140 which passes through the adapter 100 without passing through any other adapters. This arrangement in which the adapter 100 is not connected to another adapter may be used, for example, when only one adapter 100 is being deployed. For example, in a system 190 with two PSUs 115, one of the PSUs 115 may be connected directly to a socket of the primary system board 140 (without any adapter) while the other PSU 115 may be connected to the primary system board 140 via adapter 100. This arrangement could also be used even in deployments in which multiple adapters are used, in which case each adapter 100 may have its own separate cabled connection (via power cables 130) to the system board 140, without there being a shared power plane among the adapters 100.

In other examples, the adapter 100 may be connected to one or more other adapters via one or more inter-adapter cable(s) 136. In some examples, the adapters 100 may be connected together in a daisy chain fashion, with each adapter 100 being connected to another adapter 100 via inter-adapter cable(s) 136 and with all of the adapters 100 being electrically connected together to form shared or common primary and ground power planes. In this arrangement, the circuits established between each PSUs 115 and the primary system board 140 will pass through all of the connected adapters 100. More specifically, a group 124*a* of each adapter 100 may be connected by an inter-adapter cable 136 to a group 124*a* of another adapter 100 such that the ground buses 116 of all the adapters 100 are electrically connected together. Similarly, a group 124*b* of each adapter 100 may be connected by an inter-adapter cable 136 to a group 124*b* of another adapter 100, such that the primary buses 116 of all the adapters 100 are electrically connected together. The inter-adapter cables 136 could all be physically separate or they could be physically bundled together into one more cable assemblies. The number of inter-adapter cables 136 that are needed may vary depending on the number of adapters 100.

In addition to the inter-adapter cables 136 connecting the ground and power planes of the adapters together, the ground and power planes of the adapters 100 are connected to the system board 140 by power cables 130. More specifically, one power cable 130 may connect the group 122 of one of the adapters 100 to the primary system board 140, thus electrically connecting the shared ground plane of all the adapters to the system board 140. Similarly, another power cable may connect the group 123 of another one of the adapters 100 to the primary system board 140, thus electrically connecting the shared primary plane of all the adapters to the system board 140. In some examples, only two power cables 130 are needed regardless of the number of adapters 100 which are used (these cables 130 may be physically sperate or bundled together). This can be convenient when the system board has a limited number of board power sockets 141. Note that, although two power cables 130 are shown in FIG. 1 connected to the adapter 100, in examples where multiple adapters 100 are connected together, some adapters 100 are only connected to one power cable 130, and some adapters 100 might not be connected (directly) to any power cables 130 at all.

The information processing device 190 also includes the primary system board 140, which is attached to and supported by a chassis. A "system board," as used in this disclosure, is a central circuit board comprising a central processing unit (CPU) and supporting circuitry, and configured to enable connection and integration among a plurality of components and devices. In examples, primary system board 140 may include an OCP primary board. In an instance, "OCP primary board," is a primary board configured for OCP form factor. In some instances, a primary board which complies with OCP form factors may be referred to as a Host Processor Module (HPM). In instances, primary system board includes the board power sockets 141 and board sideband socket 142. As used herein, the "board power socket" is a standardized socket configured to connect with low voltage, such as 12*v*, and ground connectors. The "board sideband socket," as used herein, is a standardized socket used for out-of-band communication with components. For example, the board sideband socket 142 is used for out-of-band communication with a PSU connected to the primary system board 140 through the adapter 100. In instances, board power socket 141 and board sideband socket 142 may be configured to connect to an OCP compliant edge connector 110, such as a platform infrastructure connectivity power (PICPWR) power connector form factor. In instances, board power socket 141 and board sideband socket may be located I separate areas of an HPM. In some instances, board power socket 141 and board sideband socket 142 may be located adjacent to each other. In some instances, board power socket 141 and board sideband socket 142 may be in a configuration as to be one socket. In instances, the board power socket 141 may be, or include, a PICPWR distribution connector. In an example where board power socket 141 is a PICPWR, the board sideband socket 142 may also be a part of the PICPWR. Although only one board power socket 141 is illustrated, multiple may be present. In particular, the second connector 142 of each power cable 130 may be connected to its own board power socket 141. These board power sockets 141 may be physically separate from one another in some examples or may be physically bundled together in other examples. In examples in which the sockets 141 are physically bundled together, they may share some parts in common, such as the same outer housing.

Figure 2:
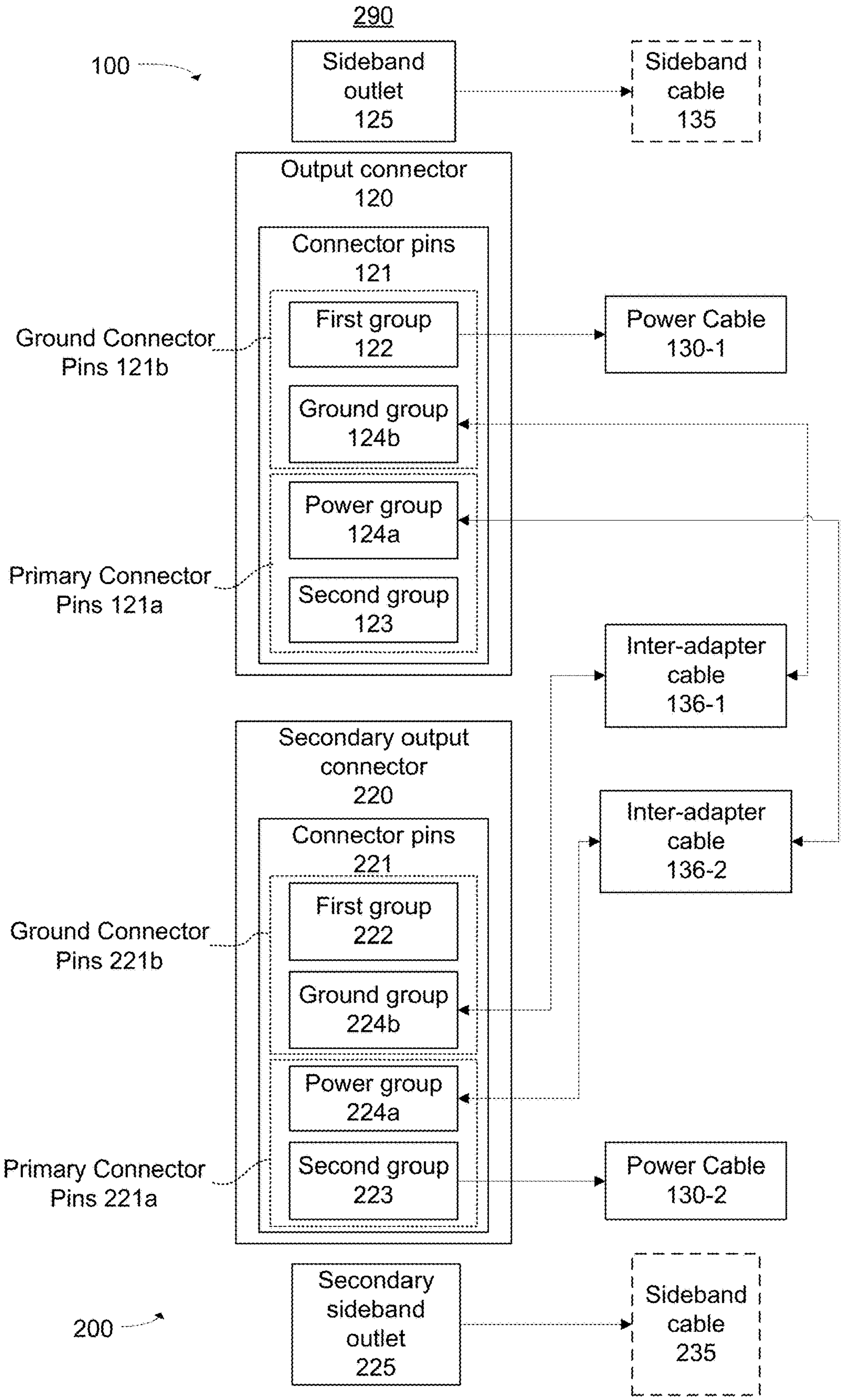
FIG. 2 is a block diagram of the power supply unit connector and output connector of FIG. 1 connected to a second power supply unit connector through connector pins.

FIG. 2, discussed below, illustrates one example deployment in which two adapters 100 and 200 are connected together. The same principles would apply, however, to larger deployments in which three, four, or any desired number of adapters are connected together.

In instances, a sideband cable 135 may be connected to the sideband outlet 125 of the adapter 100. For example, although the adapter 100 includes the sideband contacts 108 and the sideband outlet 125, the PSU being used might not have sideband capabilities (i.e. does not have sideband pins 113). In such example, the sideband cable 135 might likely not be used. In examples where the PSU does have such capability, the sideband cable 135 may be connected to the sideband outlet 125 at a first end and connected to the board sideband socket 142 of the primary system board 140.

In instances, ground conductor assembly 102, primary conductor assembly 105 and sideband contacts are housed within the casing 109. In some instances, sideband outlet 125 may be housed within an opening of casing 109. In some instances, sideband outlet 125 may be attached to casing 109. For example, sideband outlet 125 may include latching protrusions configured to latch to an opening of casing 109. Casing 109 may be made of high electrical resistance materials, such as plastics or rubber. In some instances, casing 109 may include attachment features configured to engage with a PSU cage housing the power supply unit to attach the adapter 100 to the PSU cage. For example, attachment features may include fasteners, such as screws, snap-fit connectors, plastic rivets, push pins, and the like.

In some instances, the power supply unit connector 101 and the casing 109 are integrally attached (part of the same monolithic body). In other words, the casing 109 may form an outer housing portion of the power supply unit connector 101.

In instances, the output connector 120 includes one or more connector housings which are formed separately from and then later connected to casing 109. For example, casing 109 may include grooves which the connector housings may attach, such as through protrusions on the side of the housing configured to mate with the grooves. In this example, connector housing may include features for clearing the grooves for detachment, such as pressing the sides of the housing until the sides of the housing are no longer mated with the grooves of the casing 109, after which the housing may be pulled away from the casing 109. In some examples, connector housings may include features for more permanently attaching to the casing 109, such as fasteners, where a tool may be required for detachment. In some instances, the connectors housings may be located at an opening of the casing 109, or houses within the casing 109. In some examples, the connector housings are not necessarily directly attached to the casing 109 but are instead kept in place one or in the casing 109 by the attachment of the connector pins 121 to the first and second plate assemblies 104/107. In still other examples, the output connector 120 and the casing 109 are integrally attached (part of the same monolithic body), i.e., the casing 109 may form one or more connector housing of the output connector 120. One example of a connector housing of the output connector 120 is described in more detail in reference to FIGS. 5-7.

Referring to FIG. 2, an assembly 290 that includes adapter 100 in association with a second adapter 200, power cable 130, sideband cable 135 and an inter-adapter cable 236 is presented. It should be noted that some components of adapters 100 and 200 are omitted for illustrative purposes. In some examples, adapter 200 is structurally identical to adapter 100, with corresponding components of each having reference numbers with the same last two digits (e.g., 101 and 201). The adapters 100 and 200 may be connected to respective PSUs, such as the PSU 115, which are omitted from view in FIG. 2.

Continuing with this example, referring to FIG. 2, adapter 200 comprises a power supply unit connector (not illustrated) and a secondary output connector 220. The power supply unit connector and secondary output connector 220 of adapter 200 may be similar to (in some examples, identical to) the power supply unit connector 101 and output connector 120, respectively, of adapter 100. Secondary output connector 220 thus includes connector pins 221, which may be similar to connector pins 121, and the power supply unit connector includes a ground conductor assembly and a primary conductor assembly, which may be similar to the ground conductor assembly 102 and a primary conductor assembly 105, respectively. The connector pins 221 include ground connector pins **221*b* connected to the ground conductor assembly (not illustrated), together forming a ground bus for the adapter 200. The connector pins 221 also include primary connector pins 221*a* connected to the primary conductor assembly (not illustrated), together forming a primary bus for the adapter 200. The ground connector pins 221*b* and the primary connector pins 221*a* each include multiple groups of connector pins 221, as described above. Specifically, ground connector pins 221*b* include first group 222 and ground group 224*b*, while primary connector pins 221*a* include second group 222 and power group 224*a***.

FIG. 2 illustrates an example in which two adapters 100/200 are present (each connected to a corresponding PSU, not illustrated) and they are interconnected by inter-adapter cables 136. In this example, because there are two adapters 136, there are two inter-adapter cables 136-1 and 136-2 used to interconnect them-one cable 136-1 for connecting the ground busses of the adapters 100/200 together and another cable 136-2 for connecting the primary busses of the adapters 100/200 together. Inter-adapter cables 136-1 and 136-2 could be physically separate or could be physically bundled together, as explained above.

More specifically, one connector of inter-adapter cable 136-1 is connected to a group of the ground pins **121*b* of the adapter 100, which are labeled herein the ground group 124*b*, and the other connector of the inter-adapter cable 136-1 is connected to a group of the ground pins 221*b* of the adapter 200, which are labeled herein the ground group 224*b*. In addition, one connector of inter-adapter cable 136-2 is connected to a group of the primary pins 121*a* of the adapter 100, which are labeled herein the power group 124*a*, and the other connector of the inter-adapter cable 136-1 is connected to a group of the power pins 221*a* of the adapter 200, which are labeled herein the power group 224*a*. In some instances, inter-adapter cable(s) 236 (or portions thereof) may be bundled together with portions of power cable(s) 130, as explained above. In this example, the power connection to the primary system board 140 (not shown in this example) is provided by the connection of second group 123 of connector pins 121 to first connector 131 and the ground connection is provided by the connection of first group 222 of connector pins 221 to first connector 131. In other examples, the connections may be reversed, where first group 122 provides the ground connection while second group 223** provides the power connection.

In this example, referring to FIG. 2, power and ground group **124*a*/124*b* of pins of output connector 120 are used as redundancy pins. As referred herein, "redundancy pins" are a subset of connector pins 121 that are connected to other adapters and power supply units for redundancy purposes. For example, ground group 124*b* pins are electrically connected (and physically attached) to ground conductor assembly 102 and power group 124*a* pins are electrically connected (and physically attached) to primary conductor assembly 105 of the power supply unit connector 101, where inter-adapter cable 136 is used to connect the first PSU to a second PSU through adapter 200. In this example, power group 124*a* electrically connects to a power group 224*a* of connector pins 221 in adapter 200 and ground group 124*b* electrically connects to a ground group 224*b* of connector pins 221 of connector pins 221. In this example, connection between power and ground groups 124*a*/124*b* with power and ground groups 224*a*/224*b* enables current to flow between the adapters, where in the event of a PSU failure, the connection allows current to flow between the functioning PSU and the primary system board 140** through the adapter connected to the non-functioning PSU.

As used herein, the ground conductor assembly 102 and the first group 122 and ground group **124*b* form a ground (GND) bus, while the primary conductor assembly 105 and the second group 123 and power group 124*a* form a power (PWR) bus. In an example, PWR bus may be a 12 v bus. Similarly, ground conductor assembly 202 with first group 222 and ground group 224*b* also form another GND bus, while primary conductor assembly 205** with second group

223 and power group 224*a* form another PWD bus. The same configuration would apply for other adapters, if more than two are used.

One adapter is connected to another adapter through inter-adapter cables forming a daisy chain, with a first or second group of pins of a first adapter being connected to the primary system board 140 and a first or second group of pins of the last adapter on this chain being also connected to the primary system board 140. As noted above, one adapter at one end of the chain would have a ground connection with the board, while another adapter at another end of the chain would have a power connection with the board. The GND buses for all adapters used would be electrically connected to each other. Similarly, all PWD buses for all adapters would be connected to each other.

Although the example in reference to FIG. 2 only shows two adapters, it should be understood that more adapters and power supply units can be used for redundancy. For example, the GND and PWD buses of second adapter 200 may electrically attach to a third adapter by connecting a third inter-adapter cable (not shown) to first or second groups 222/223, depending on the configuration, and to GND and PWD bus pins of the third adapter. In this example, a third power supply unit may provide additional redundancy to the system where the HPM would continue to have power in the event of failure of two power supply units. In some instances, a fourth adapter, connected to a fourth PSU, may also be used for redundancy. In the example with a fourth PSU being used for redundancy, pins of the GND and PWD buses of the third adapter would be connected, through a third inter-adapter cable to respective pins of the GND and PWD buses of a fourth adapter. As mentioned above, the GND or PWD bus of the first adapter used would connect to the primary system board 140, while of the opposite bus of last adapter would also be connected to the primary system board 140. For example, if GND bus of first adapter is connected to the primary system board 140, then the PWD of last adapter is connected to the system board 140, and vice-versa. It should be noted that more PSU and adapters could be added as long as there are sufficient pins for handling the electrical flow between adapters.

In other examples, usage of redundancy pins may also enable hot swapping of PSU without interrupting the system. For example, when the PSU being used for powering the system is detached, the system starts using the second PSU for power supply. In some examples, sideband contacts 108/208 and sideband outlets 125/225 may be connected to an HPM through sideband cables 135/235. In those examples, the HPM may switch power source based on sideband signals, such as a decline in efficiency of a PSU. In some examples, the sideband signals may enable the use of load sharing and the redundancy feature using redundancy pins. As noted above, power and ground groups 124*a*/124*b* of connector pins 121 may or may not be used for redundancy. For example, in configurations where redundancy is not used, some subsets of connector pins 121 may be left unused, while other pins may connect to peripheral components and/or other loads.

In an example, inter-adapter cable 136 may be removably attached to power/ground group 124*a*/124*b* of pins and power/ground group 224*a*/224*b* of pins, where redundancy signals are transmitted between power supply units. In this example, both adapters 100 and 200 (and the power supply units connected thereto) are connected to an HPM through power cables 130. Specifically, one power cable 130-1 connects to adapter 100 while the other power cable 130-1 connects to the adapter 200 (these power cables 130-1 and 130-2 could be physically separate or physically bundled, as explained above). In the illustrated example, the power cable 130-1 connects to a GND bus of the adapter 100 by way of the first connector 131 (not illustrated in FIG. 2) of the cable 130-1 engaging with a group of the ground pins 121*b*, which are labeled herein the first group 122. However, as noted above, the GND bus of the adapter 100 is electrically connected to the GND bus of the adapter 200 via inter-adapter cable 136-1, and therefore the cable 130-1 is electrical connected (directly or indirectly) to both GND busses (and hence to the ground pins of the PSUs connected thereto). On the other hand, the power cable 130-2 connects to a PWD bus of the other adapter 200 via the first connector 131 (not illustrated in FIG. 2) of the cable 130-2 engaging with a group of the power pins 221*a*, labeled herein the second group 223. However, as noted above, the PWD bus of the adapter 100 is electrically connected to the PWD bus of the adapter 200 via inter-adapter cable 136-2, and therefore the cable 130-2 is electrical connected (directly or indirectly) to both PWD busses (and hence to the power pins of the PSUs connected thereto). Accordingly, electrical circuits are established between the PSUs and the HPM which traverse the adapters 100 and 200, the power cables 130-1 and 130-2, and the inter-adapter cables 136-2 and 136-2. The HPM may thus draw power from both power supply units concurrently, with the adapters 100 and 200 presenting, in essence, as shared or common power plane to the HPM. In the event of a failure of one power supply unit, the aforementioned circuits remain uninterrupted. In such a failure event, the HPM would continue to receive supplied current from the remaining PSU via the power cable 130-2 connected to one adapter 200 and to return current to the PSU via the power cable 130-1 connected to the other adapter 100, even if one of the PSU are no longer functioning or even present. In other words, the adapter 100 or 200 which is connected to the failed PSU still continues to function to supply power to the HPM notwithstanding the failure of the PSU.

Figure 3:
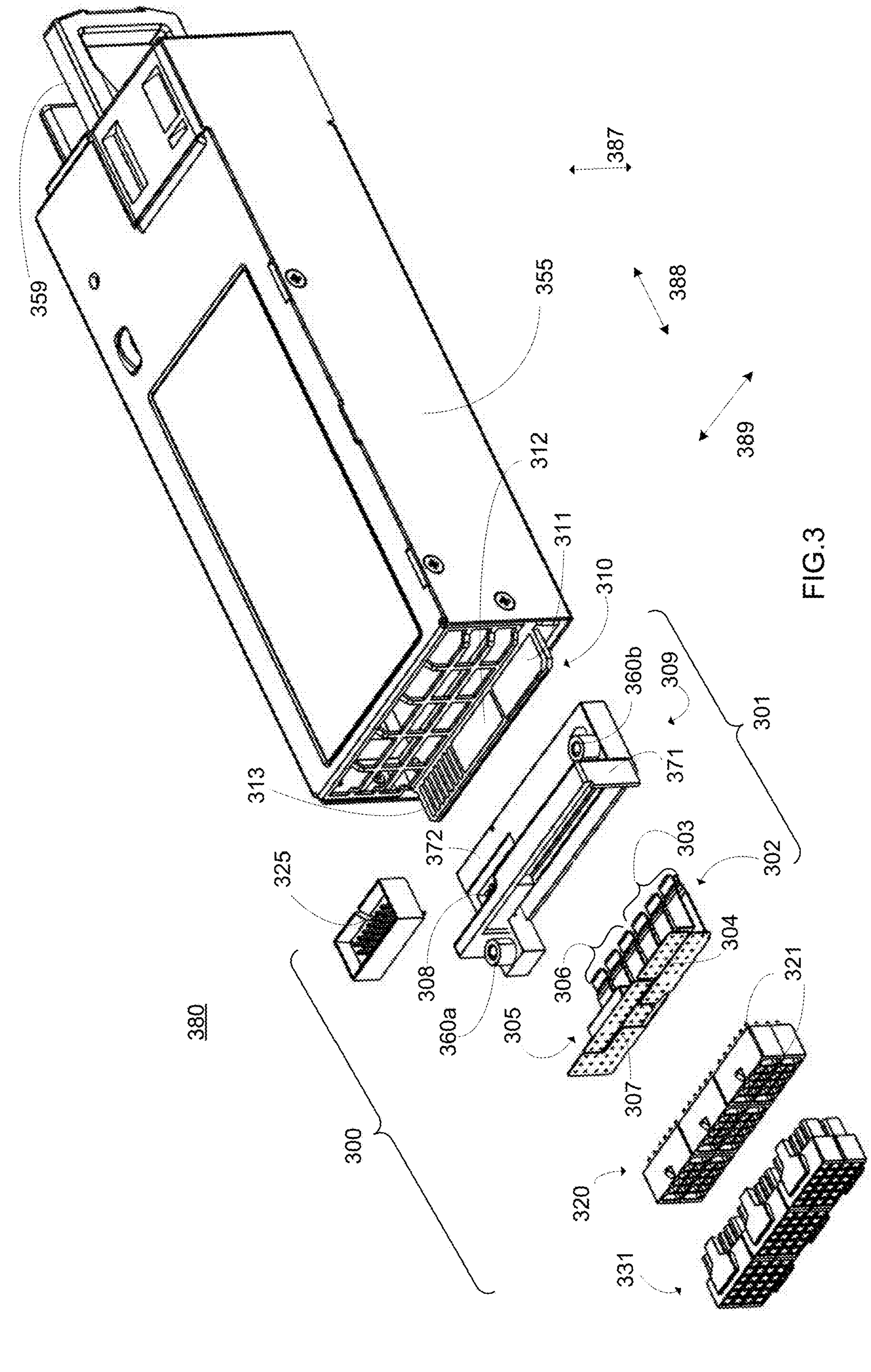
FIG. 3 is an exploded view of an example adapter that includes an output connector, a power supply unit connector, including a casing, and power supply edge connector included in a power supply unit.
Figure 4A:
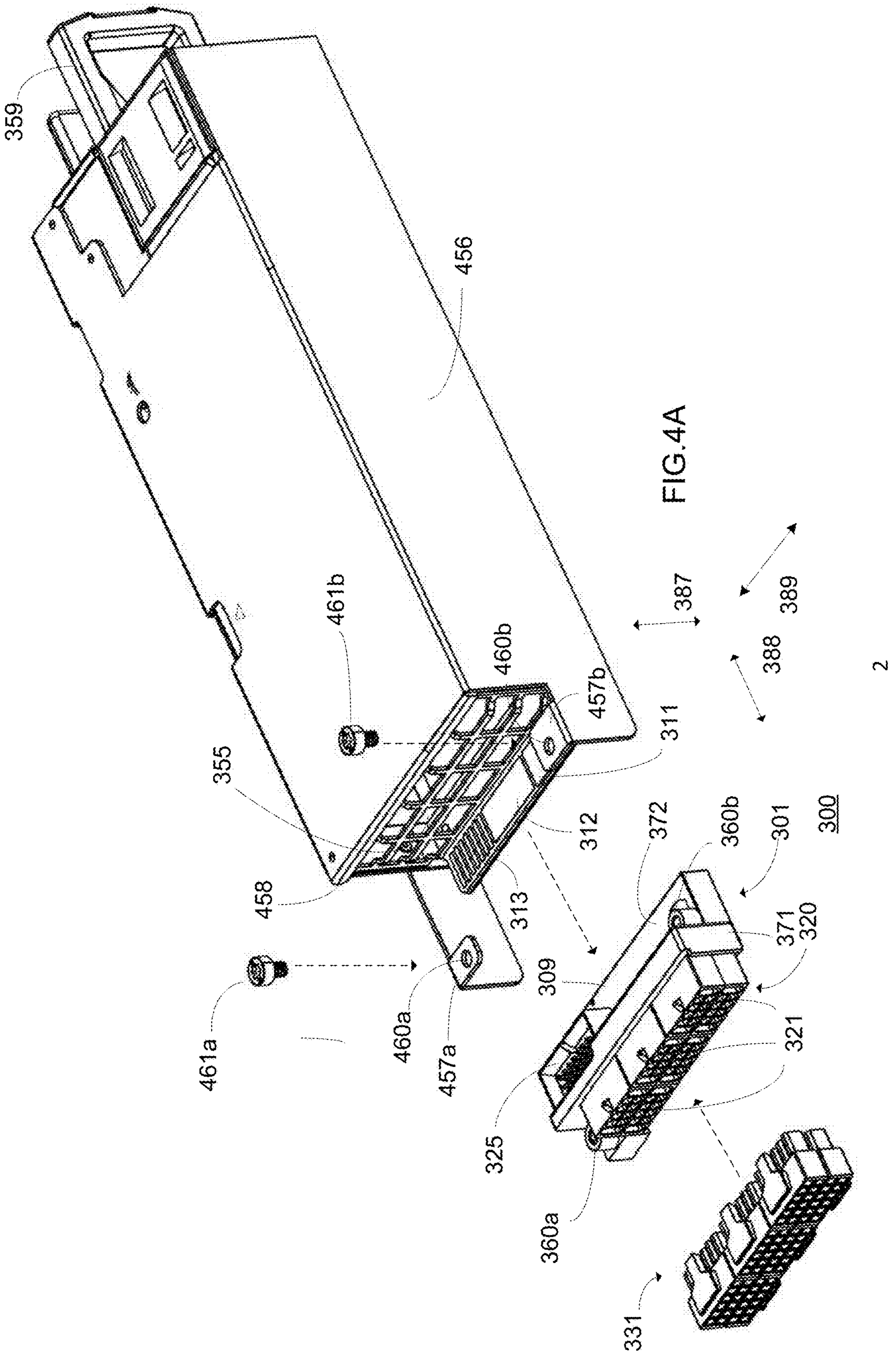
FIG. 4A is a top perspective view of the assembly and power supply unit of FIG. 3 in an uninstalled position, with the power supply unit housed within a cage and the adapter fastened to the cage.
Figure 4B:
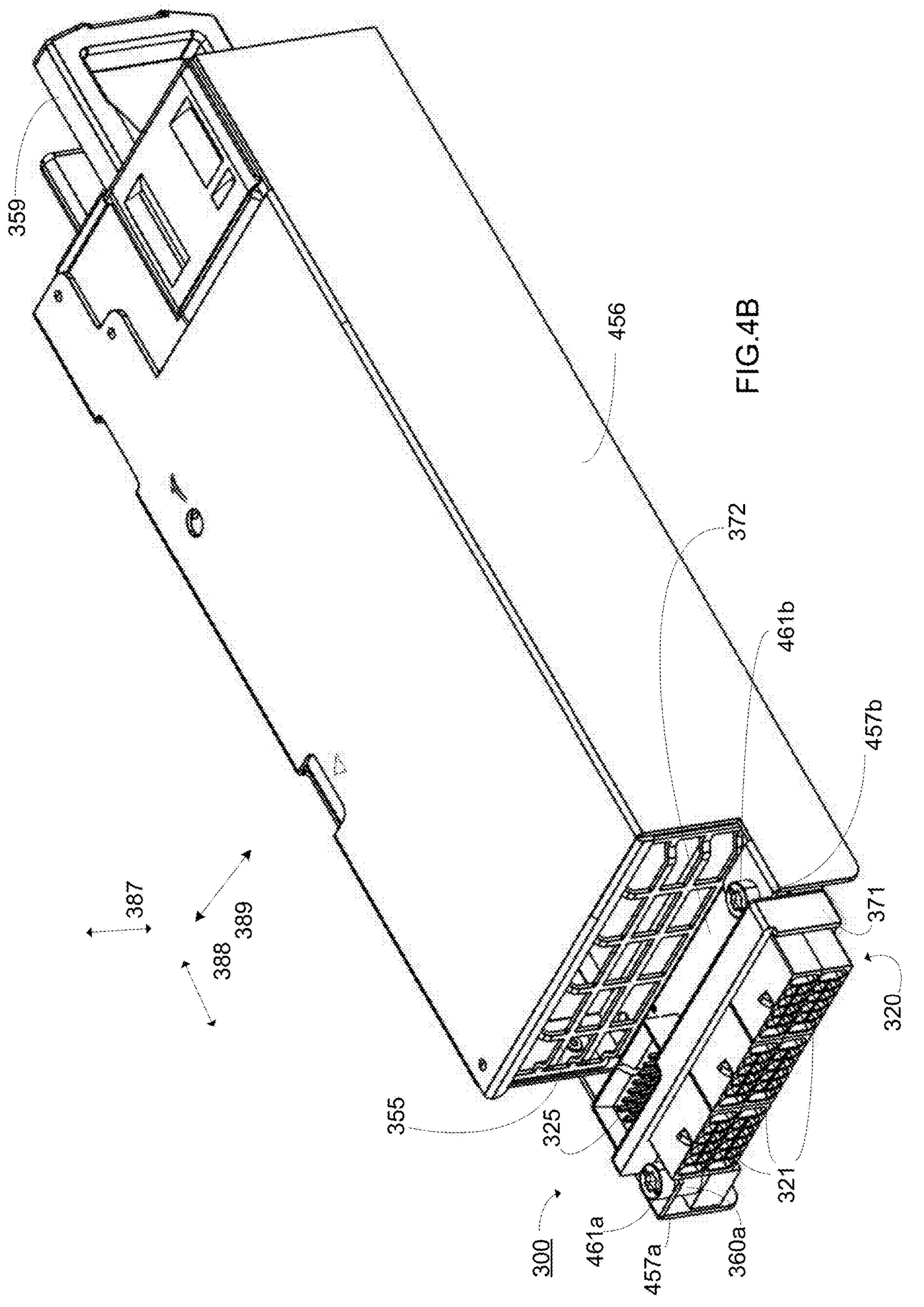
FIG. 4B is a top perspective view of the assembly and power supply unit of FIG. 3 in an installed position, with the power supply unit housed within a cage and the adapter fastened to the cage.
Figure 5A:
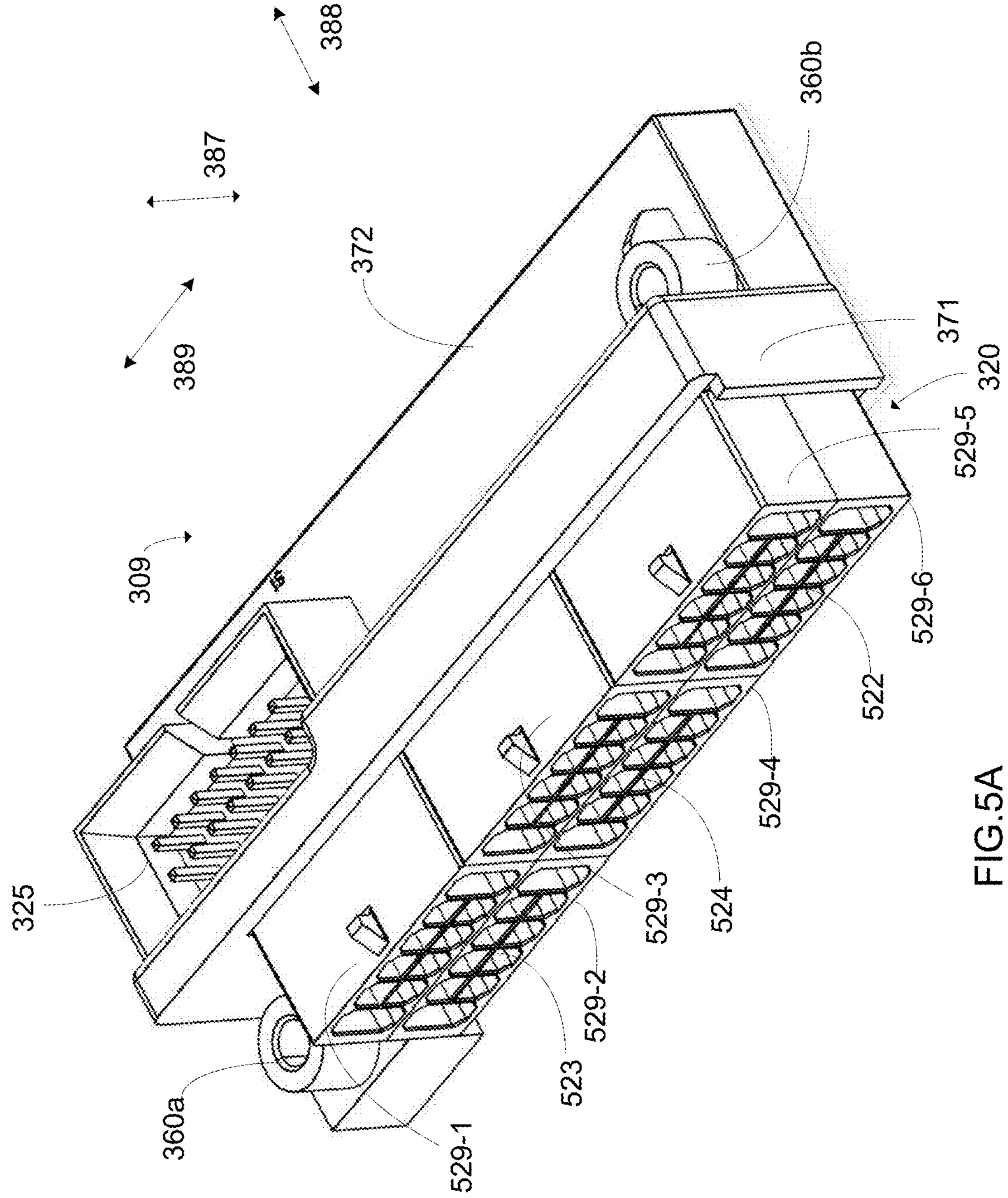
FIG. 5A is a top rear perspective view of the adapter of FIG. 3.
Figure 6:
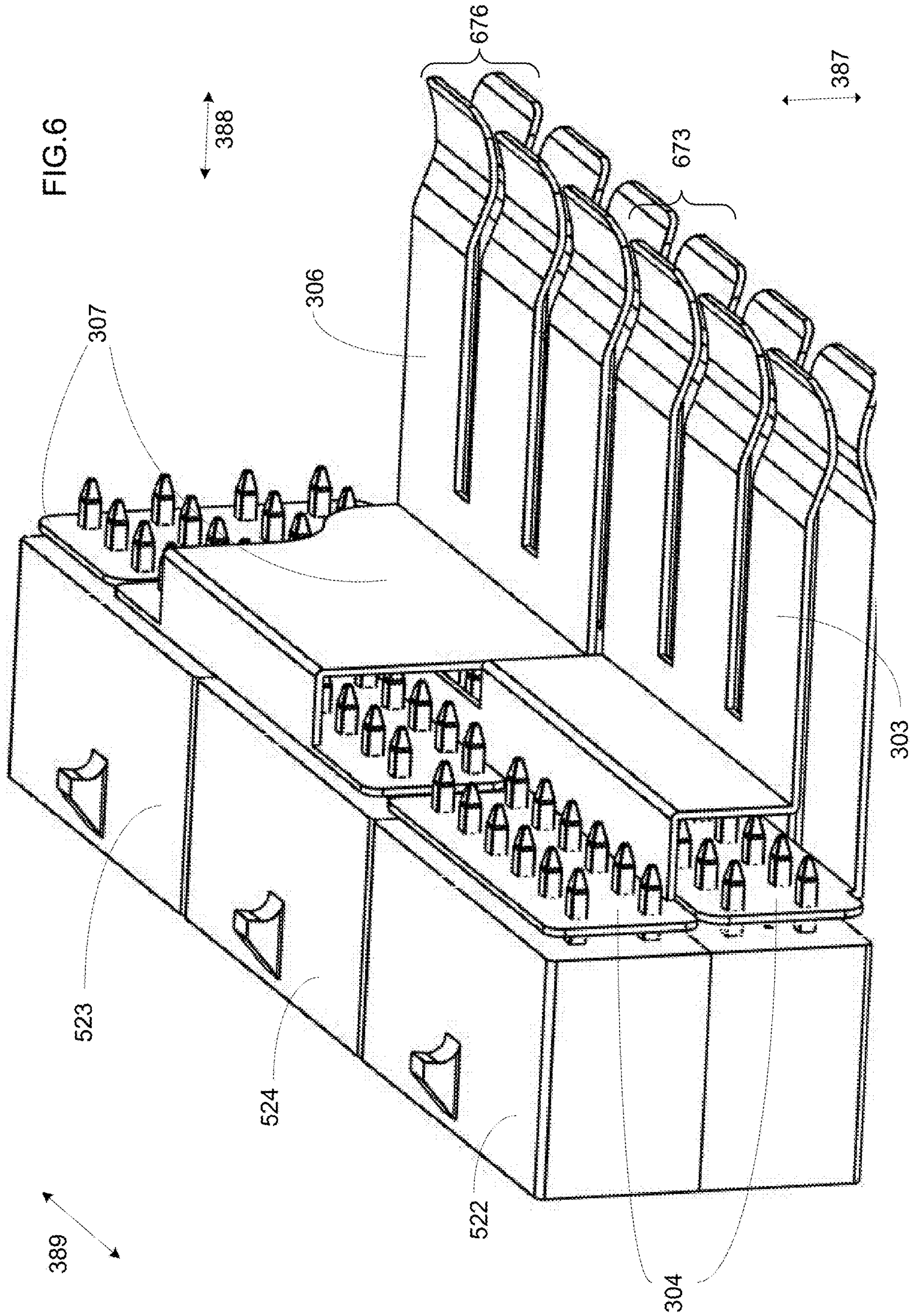
FIG. 6 is a side perspective view of the output connector, ground and conductor assemblies of FIG. 3 in the attached position.
Figure 7A:
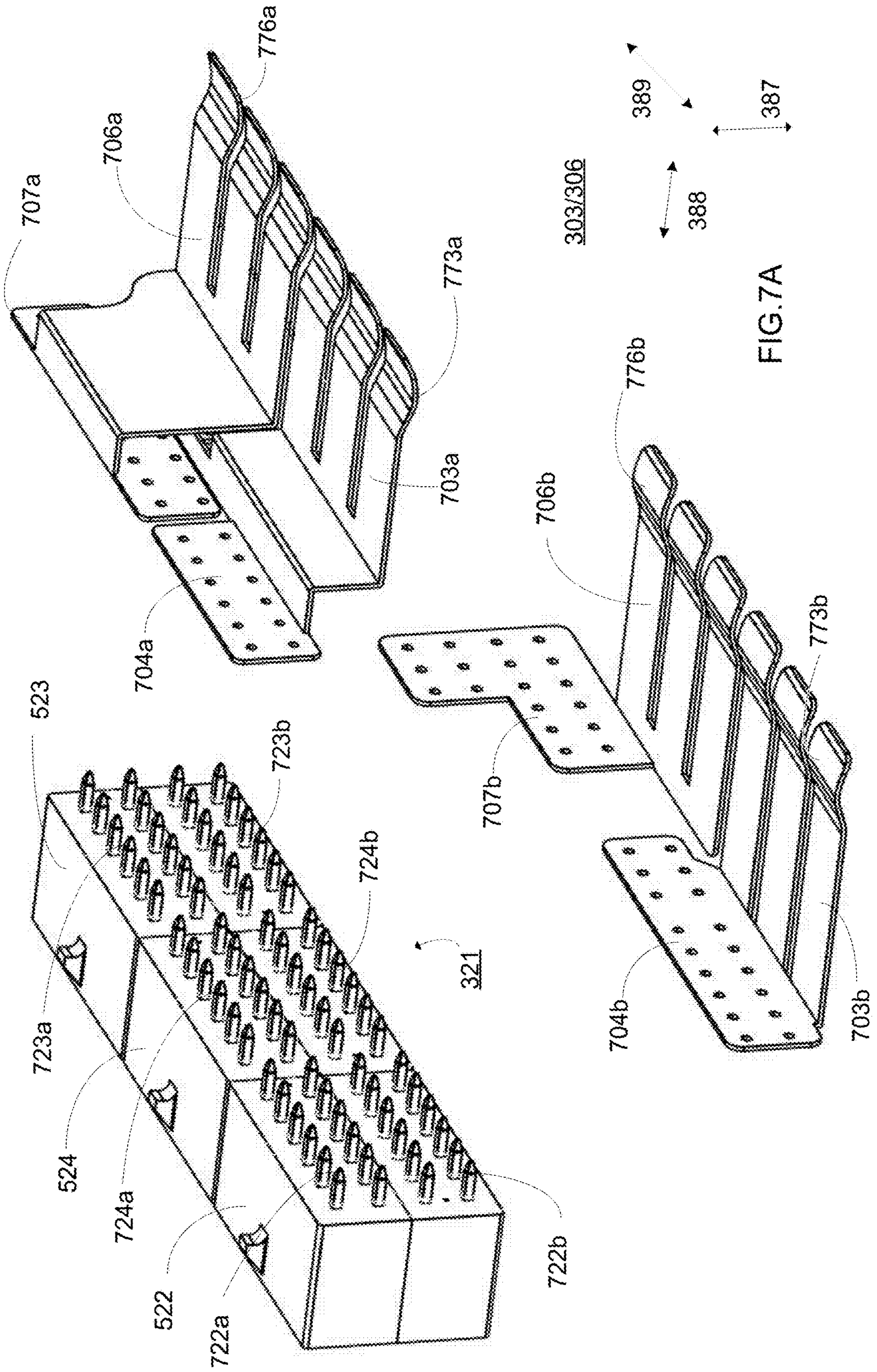
FIG. 7A is an exploded view of the output connector, ground and primary conductor assemblies of FIG. 3 showing the components from a top front perspective view.
Figure 7B:
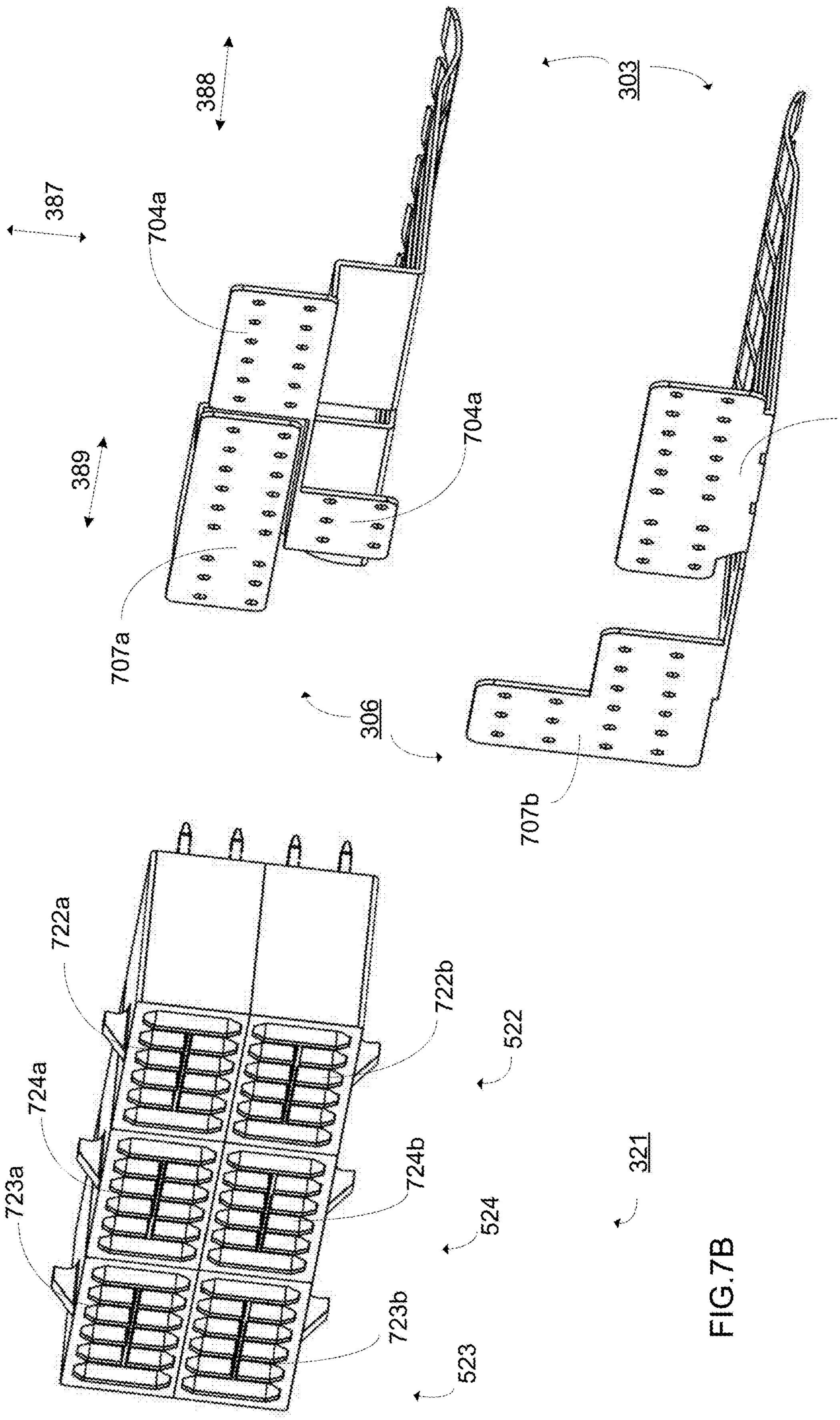
FIG. 7B is an exploded view of the output connector, ground and primary conductor assemblies of FIG. 3 showing the components from a rear perspective view.
Figure 7C:
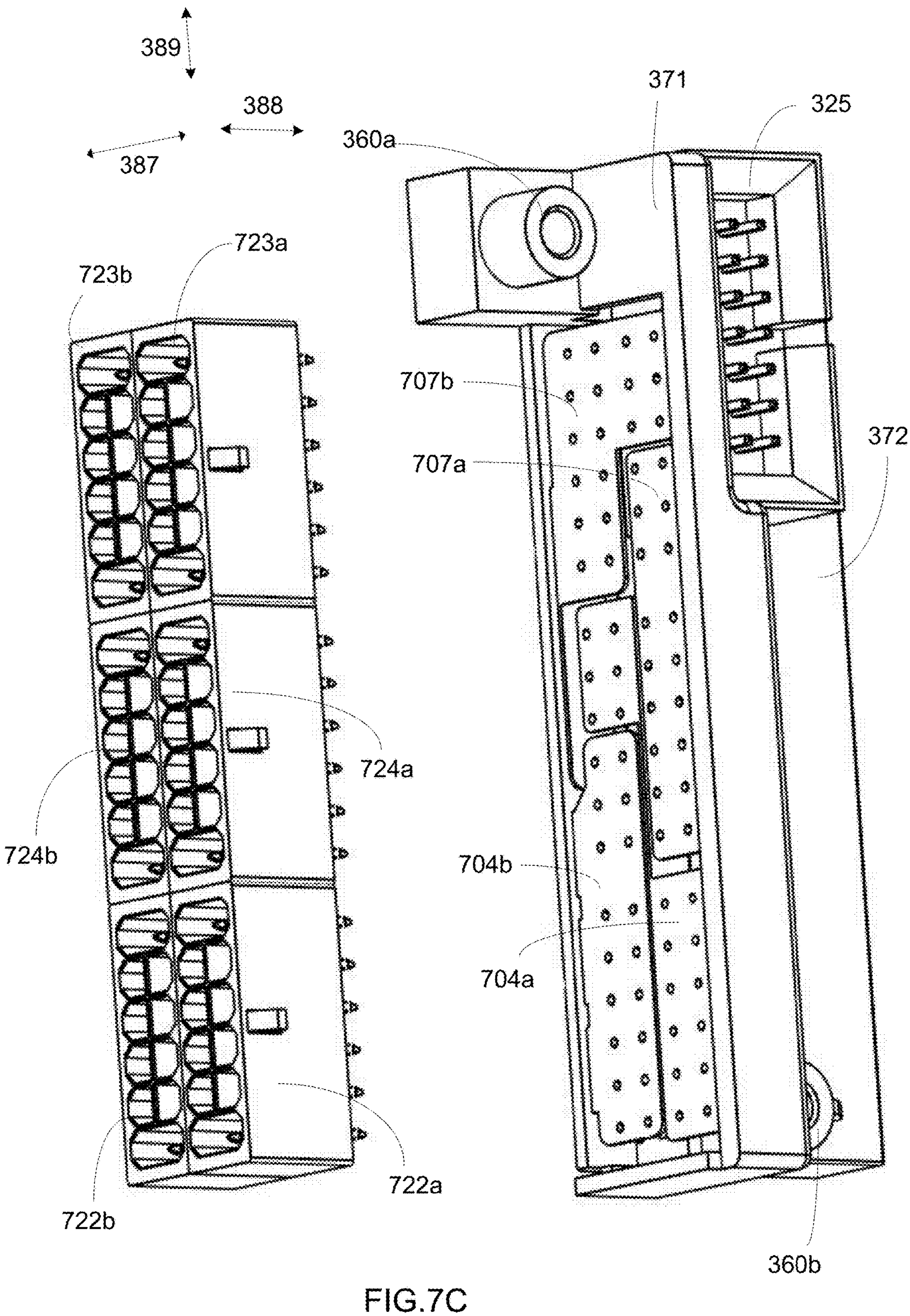
FIG. 7C is a top perspective view of the output connector, ground and primary conductor assemblies, housed within the casing, of FIG. 3.

Now referring to FIGS. 3-8, an example of adapter 300 will be described, as well as various assemblies and systems which may include the adapter 300. The adapter 300 is illustrated in association with example first connectors 331 of one or more cables (such as power cables and/or inter-adapter cables) and an example PSU 355 with an edge connector 310. FIGS. 3, 4A, and 4B show an assembly 380 of adapter 300 and PSU 355. FIGS. 2-5B and 8 show adapter 300 in a fully assembled state with casing 309 present. FIGS. 6-7B show the adapter 300 with some portions (such as casing 309) omitted from the views to reveal internal structures. Specifically, FIGS. 6-7B illustrate an output connector 320, ground conductor assembly 302 and primary conductor assembly 305 of the adapter 300, with FIG. 6 illustrating these parts in an assembled state and FIGS. 7A and 7B illustrating them in exploded views. FIG. 7C illustrates the adapter in a partially exploded view. The adapter 300, assembly 380, first connectors 331 and PSU 355 with edge connector 310 are described simultaneously below for ease of understanding. However, it should be noted that the adapter 300, assembly 380, first connectors 331 and PSU 355 with edge connector 310 may be produced or sold separately or together and may be claimed separately or together herein. The adapter 300 is an example implementation of adapter 100. Assembly 380 is an example implementation of assembly 180. The edge connector 310 is an example implementation of edge connector 110. The first connectors 331 are example implementations of first connector 131. Elements in FIGS. 3-8 and elements of FIGS.

1-2 whose reference numbers have the same last two digits as elements described above in relation to FIGS. 1 and 2, such as 121 and 321, correspond to one another, with elements in FIGS. 3-8 being one implementation example of the corresponding element in FIG. 1-2.

Elements in reference to FIGS. 3-8 are described using vertical 387, longitudinal 388 and latitudinal 389 directions for ease of description. However, it should be noted that these directional descriptions are used only relative to the position of the edge connector 310 of PSU 355. As such, for example, vertical position 387 could include a horizontal position relative to the ground, depending on the orientation of the PSU 355.

Adapter 300 includes a power supply unit connector 301, an output connector 320, sideband outlet 325, and a casing 309 which physically supports, houses, and/or forms portions of the power supply unit connector 301, the output connector 320, and sideband outlet 325.

Figure 5B:
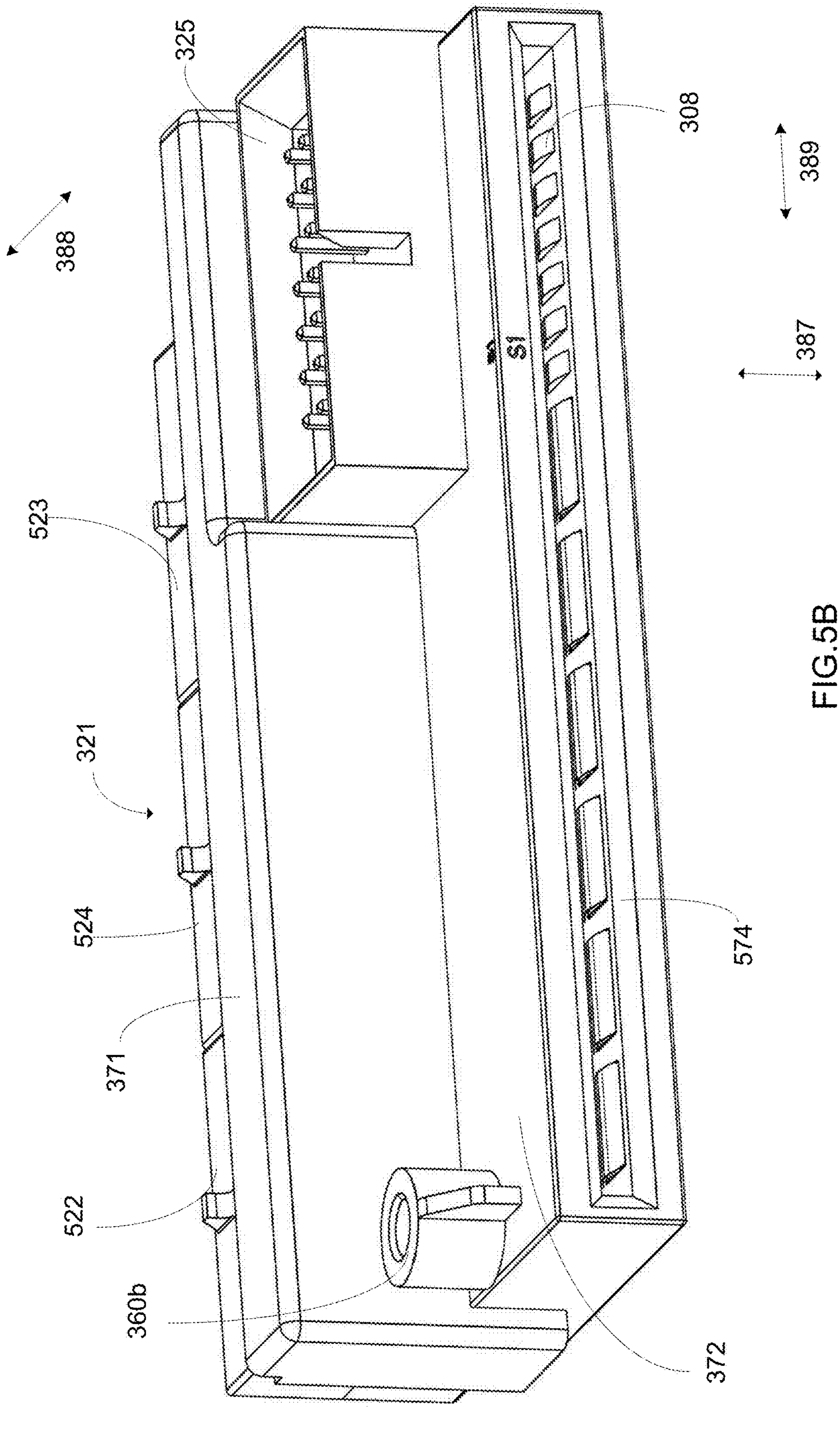
FIG. 5B is a top front perspective view of the adapter of FIG. 3.
Figure 8:
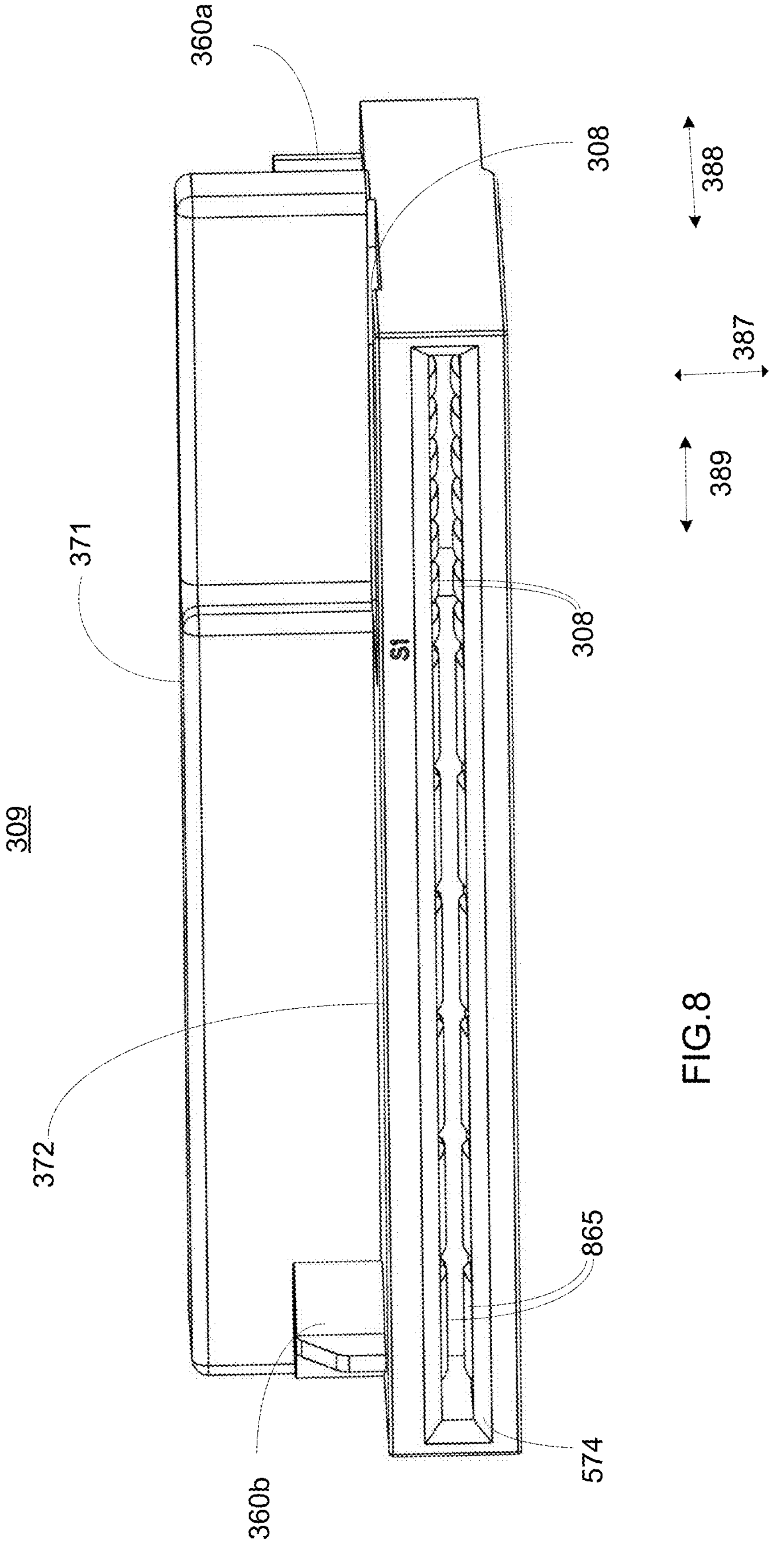
FIG. 8 is a front perspective view of the casing of FIG. 3.

Example power supply unit connector 301, includes a socket 574 (see FIGS. 5B and 8), ground conductor assembly 302 (see FIGS. 3 and 6-7C), a primary conductor assembly 305 (see FIGS. 3 and 6-7C), and sideband contacts 308 (see FIGS. 5B and 8). The socket 574 is formed by casing 309 and is configured to removably receive edge connector 312 of PSU 355. These components will be described in greater detail in turn below.

Example ground conductor assembly 302 includes one or more first conductivity clamps 303. In this example, ground conductor assembly 302 includes three first conductivity clamps 303. However, it is noted that other examples may have other configurations that include one or more first conductivity clamps 303. For example, in some configurations ground conductor assembly 302 could include only one conductivity clamp 303, where the clamp would have the same length in the lateral direction 389 as the three conductivity clamps 303 in this example. In some other examples, ground conductor assembly 302 could include five conductivity clamps 303, where the five clamps would have the same length in the lateral direction 389 as the three conductivity clamps 303, with each individual clamp having a shorter length. As the first conductivity clamps 303 are used for ground connection between the PSU 355 and an HPM (not shown in this example), the number of clamps included as part of first conductivity clamps 303 may vary and include other configurations not described herein, as long as all pins included in ground pins 311 are in contact with the clamps.

Example primary conductor assembly 305 includes one or more second conductivity clamps 306. In this example, primary conductor assembly 305 also includes three second conductivity clamps 306. However, as described above for ground conductor assembly 302, other examples of primary conductor assembly 305 may also include other configurations, such as, for example and without limitation, configurations that include only one second conductivity clamp 306 or configurations that include five second conductivity clamps 306. As described above, examples of second conductivity clamps 306 may include varying lengths and number of clamps, as long as all pins included in primary pins 312 are in contact with the clamps. For example, regardless of number of clamps used, first and second conductivity clamps 303/306 are configured to contact all pin spacing configurations of edge connector 310 ranging from smaller distances, such as 0.5 mm, to larger distances, such as 2.84 mm.

Referring to FIG. 6, example first and second conductivity clamps 303/306 include duckbill lips 673/676 configured to open when edge connector 310 is inserted. As used herein, "duckbill lips" are the concave shaped receding end of the conductivity clamp 303/306 that engages with the ground or power pins 311/312 of the edge connector 310, where the duckbill lips 673/676 includes a sloped tip configured to open the clamps by pressing the edge connector 310 against it. For example, as the edge connector 310 pushes against the sloped tip of the duckbill lip 673/676, the top portion and the bottom portion of the first and second conductivity clamps 303/306 move away from each other as to allow the edge connector 310 to be inserted. Once the edge connector 310 is inserted, the receding portion of the duckbill lips 673/676 contacts the ground or power pins 311/312.

Referring to FIGS. 7A and 7B, the example ground and primary conductor assemblies 302/305 include a bottom and top sections. The top section of first and second conductivity clamps 303/306 include top bars 703*a*/706*a* and duckbill lips 673/676 includes top lips 773*a* and 776*a*, respectively. While the bottom section of first and second conductivity clamps 303/306 includes bottom bars 703*b*/706*b* and duckbill lips 673/676 includes bottom lips 773*b*/776*b*. The top section of first and second plate assemblies 304/307 include top plates 704*a* and 707*a*, respectively. The bottom section of first and second plate assemblies 304/307 include bottom plates 704*b* and 707*b*, respectively. The top and bottom plates are described in reference to the intersecting areas between first and second plate assemblies 304/307 and first and second conductivity clamps 303/305. For example, bottom plate 707*b* extends upwards from the intersecting area between the bottom plate 707*b* and bottom bar 706*b* and the front face of part of the plate 707*b* is in the same plane as top plate 707*a*. Similarly, in this example, a portion of top plate 704*a* extends sideways from the intersecting area between top plate 704*a* and top bar 703*a* to the same front face plane as bottom plate 704*b*.

Continuing to refer to FIGS. 7A and 7B, first and second plates 304/307 extend in the latitudinal direction 389 sufficiently to include all pin connections. In this example, first and second plates 304/307 extend in the latitudinal direction 389 sufficiently to fit seventy-two (72) pin connections arranged in four rows of eighteen (18) pins. Referring to FIGS. 3 and 7C, a portion of second plate assembly 307 extend parallel to, in the latitudinal 389 direction, sideband contacts 308 and sideband outlet 325 as to fit all pin connections.

Example edge connector 310 of power supply 355, referring to FIGS. 3 and 4, includes ground pins 311, power pins 312 and sideband pins 313. In some instances, PSU 355 may include a handle 359 used for aiding in connecting and disconnecting edge connector 310.

Example output connector 320 includes connector pins 321. For ease of description, an example output connector 320 that includes connector pins 321 is presented in reference to FIGS. 5-7. Connector pins 321 includes first group 522 of pins electrically connected (and physically attached) to the first plate assembly 304 of the ground conductor assembly 302, second group pins 523 electrically connected (and physically attached) to second plate assembly 307 of primary conductor assembly 305. Connector pins 321 also include a middle group 524 of pins, with half of the pins of the middle group 524 (the bottom half) being electrically connected (and physically attached) to first plate assembly 304 and the other half (the top half) are attached to second plate assembly 307. Attachment of pins to first and second plate assemblies 302/305 is discussed in more detail in reference to FIGS. 7A-C.

As shown in FIG. 5A, the connector pins 321 are housed within connector housings 529. In this example, the output connector 320 includes six connector housings 529-1 to 529-6, which are grouped into two rows of three connector housings 529. Each connector housing 529 is configured to mate with one of the connectors 531. Each connector housing 529 includes apertures extending in the longitudinal direction 388 between the power cable facing portion and the PSU connector 301 of the output connector 320. Each aperture of the connector housing 529 houses a connector pin 321 or, in the case of the outermost apertures, two connector pins 321. A portion of each connector pin 321 protrudes through the end of the connector housing 529 to join with the top or bottom plates 704*a*/704*b*. Each aperture is also configured to receive a pin of a connector 331 in a mated state of the connector 331 with the output connector 320, with the pin of the connector 331 contacting and electrically connecting with the pin 321 housed in the aperture.

In this example, the connector pins 521 of the connector housings 529-1 to 529-3 are all connected to the ground conductor assembly 302 (i.e., one of the plates 707*a* or 707*b*). On the other hand, the connector pins 521 of the connector housing 529-4 to 529-6 are all connected to the primary conductor assembly 305 (i.e., one of the plates 704*a* or 704*b*). Referring to FIGS. 7A, 7B and 7C, first group 522 of pins, second group 523 of pins and middle pins 524 includes top and bottom sections. First group 522 of pins includes top pins 722*a* and bottom pins 722*b*. Second group 523 of pins includes top pins 723*a* and bottom pins 723 *b*. Middle pins 524 include top pins 724*a* and bottom pins 724*b*.

In the adapter 300, top pins 724*a* and bottom pins 724*b* of middle pins 524 are configured to be power and ground pins. In this example, referring to FIGS. 6 and 7A-C, top pins 722*a*, bottom pins 722*b*, and bottom pins 724*b* are electrically connected (and physically attached) to top and bottom plates 704*a*/704*b* of first plate assembly 304 forming a GND bus, while top pins 723*a*, bottom pins 723*b* and top pins 724*a* are attached to top and bottom plates 707*a*/707*b* of second plate assembly 307 forming a PWD bus. As noted in reference to FIG. 2, any pins of GND bus may be used for a ground connection with a primary system board, another adapter for redundancy or with other loads. Similarly, any pins of PWD bus may be used for power connection with a primary system board, another adapter for redundancy or with other loads. The electrical attachments are provided as an example for ease of description. The order of the attachments may differ depending on the configuration of the first and second plate assemblies 304/307.

Referring to FIGS. 3, 4A-B, 5A-B, 7C and 8, casing 309 includes a connector holder 371 and an assembly housing 372. Referring to FIGS. 5B and 8, assembly housing 372 includes a casing socket 574. As used herein, a "casing socket" is an opening on casing 309 configured to receive edge connector 310. The casing socket 574, referring to FIG. 8, includes clamp springs 865. As used herein, "clamp springs" are components that pushes the conductivity clamps 303 and 306 into a closed position. In instances, the clamp spring 865 are configured to provide force against the bottom duckbills 773*b*/776*b* and top duckbills 773*a*/776*a* sufficiently to maintain contact with edge connector 310 while providing resistance at low enough level that edge connector 310 can open the conductivity clamps 303/306 based on being pushed towards the inside of the first and second plate assemblies 304/307. In this example, clamp springs 865 are shaped as to fit into the concavity of duckbills 673/676. As noted throughout this disclosure, the compact size of adapter 300 allows for enhance airflow into the system, unlike system using a PCB. As such, the size of the adapter 309 in both the vertical 387 and the latitudinal 389 directions may be limited to a size that can house PSU connector 301 and output connector 220. Such as in this example, where casing 309 is only big enough to allow secured housing of those components.

Connector holder 371 and assembly housing 372 extend in latitudinal direction 389 sufficiently to allow insertion of edge connector 310 into casing socket 574. As used herein, "connector holder" is an opening in the casing 309 that enable the output connector 320 to attach to first and second plate assemblies 304/307. In some instances, connector holder 371 may include features that enable output connector 320 to be secured to the casing 309. For example, connector holder 371 may include a snapping feature which attaches to the output connector 320. In embodiments, connector holder 371 may provide a tight fit, such as the opening being close to the size of the output connector 320. In such example, the attachment to the casing 309 by output connector 320 is indirect, where the attachment is only to the first and second plate assemblies 304/307. In this configuration, the tight fit feature of the connector holder 371 prevents movement of the output connector 320, thus maintaining an attachment with the first and second plate assemblies 304/307 and reducing abrasion of the pins. For example, even if connector pins 321 are pressed fitted into the first and second plate assemblies 304/307, without the support of connector holder 371, the attachment may wear out and get damaged overtime due to movement created by the plugging and unplugging of first connector 331.

The assembly housing 372 included in casing 309 is a section that houses the ground conductor assembly 302, primary conductor assembly 305 and sideband contacts 308. In instances, assembly housing 372 includes an opening for attachment of the sideband outlet 325. In some instances, the attachment may be an attachment of the sideband outlet 325 to casing 309. For example, using a snapping feature. In instances, the attachment may be an attachment of the sideband contacts 308 to the sideband outlet 325.

Referring to FIG. 7C, in this example, top and bottom plates 707*a*/707*b* extend in the latitudinal direction 389 between the connector holder 371 and sideband outlet 325. In some other instances where sideband outlet 325 is located in the other end of assembly housing 372, top and bottom plates 704*a*/704*b* may extend in the latitudinal direction 389 between connector holder 371 and sideband outlet 325. As noted above, the assembly housing 372 must extend in the latitudinal direction 389 at a length sufficient to accommodate the size of edge connector 310. As such, first plate assembly 304 or second plate assembly 307 may extend towards between connector holder 371 and sideband outlet 325 in order to accommodate the dimensions of the edge connector 310 and the output connector 320 at each side of PSU connector 301.

A process of installing a PSU cage 456 to adapter 300 is described in reference to FIGS. 4A and 4B. Although the installation will be described on for PSU cage 456, it should be noted that PSU 355 could be connected to adapter 300 as part of the installation of cage 456. In this example, cage 456 includes a retention tab 458 that prevents PSU 355 from being moved further. Although the adapter 300 would prevent further insertion after connection, the retention tab aids in preventing damage to the adapter 300 due to excessive force being applied at insertion of the PSU 355. As a person of skill in the art would appreciate, inserting the PSU 355 with the cage 456 would allow using handles 359 to assist in inserting the cage 456. The process includes moving cage 456 towards adapter 300 until bent tabs 460*a* and 460*b* are above and cage apertures 460*a* and 460*b* are centered with adapter apertures 360*a* and 360*b*. Once cage apertures 460*a* and 460*b* are centered with adapter apertures 360*a* and 360*b*, the process further includes fastening fasteners 461*a* and 461*b* to the adapter apertures 360*a* and 360*b* until the head of the fasteners 461*a*/461*b* are in contact with the cage apertures 460*a*/460*b*. In instances, cage 456 may be attached to a chassis such as at a rear panel. In instances, attachment of cage 456 may include support brackets or rails. In some instances, support brackets or rails may be attached to sides or bottom of chassis. In instances, fasteners 461*a*/461*b* may further attach to support brackets or rails of the chassis.

A process of connecting power supply unit 355 to a system board using the adapter 300 will now be described in reference to FIGS. 4A and 4B. As shown in FIG. 4A, the connecting process begins by moving the PSU 355 towards adapter 300 in the longitudinal direction 388 until edge connector 310 is inside assembly housing 372. Referring to FIGS. 3, 5B and 8, moving the PSU 355 includes inserting edge connector 310 into casing socket 574 and opening conductivity clamps 303/306 by pushing top lips 773*a*/773*b* upwards against and bottom lips 776*a*/776*b* downwards against clamp springs 865 as to allow the insertion of edge connector 310. The edge connector is moved, in the longitudinal direction 388, within the casing socket 574 until the ground and power pins 311 and 312 are in contact with the apex (i.e. center of curved part) of the duckbill lips 673/676. As noted above, referring to FIG. 8, clamp springs 865 are configured to contact and push against the concavity (i.e. other side of apex) of duckbill lips 673/676 as to maintain the contact between conductivity clamps 303/306 and edge connector 310.

Connecting the power supply unit 355 to a system board further includes, referring to FIGS. 3 and 4A, connecting the first connector 331 to output connector 309, which includes moving first connector 331 in the longitudinal direction 388 towards the adapter 300 until the pins within first connector as in electrical contact with the connector pins 321.

In instances, referring to FIGS. 3, 4A-B, 5A-B and 8 connecting power supply unit 355 to a system board using the adapter 300 may include electrically connecting sideband pins 313 of the edge connector 310 to sideband contacts 308 housed within assembly housing 372.

Figure 9:
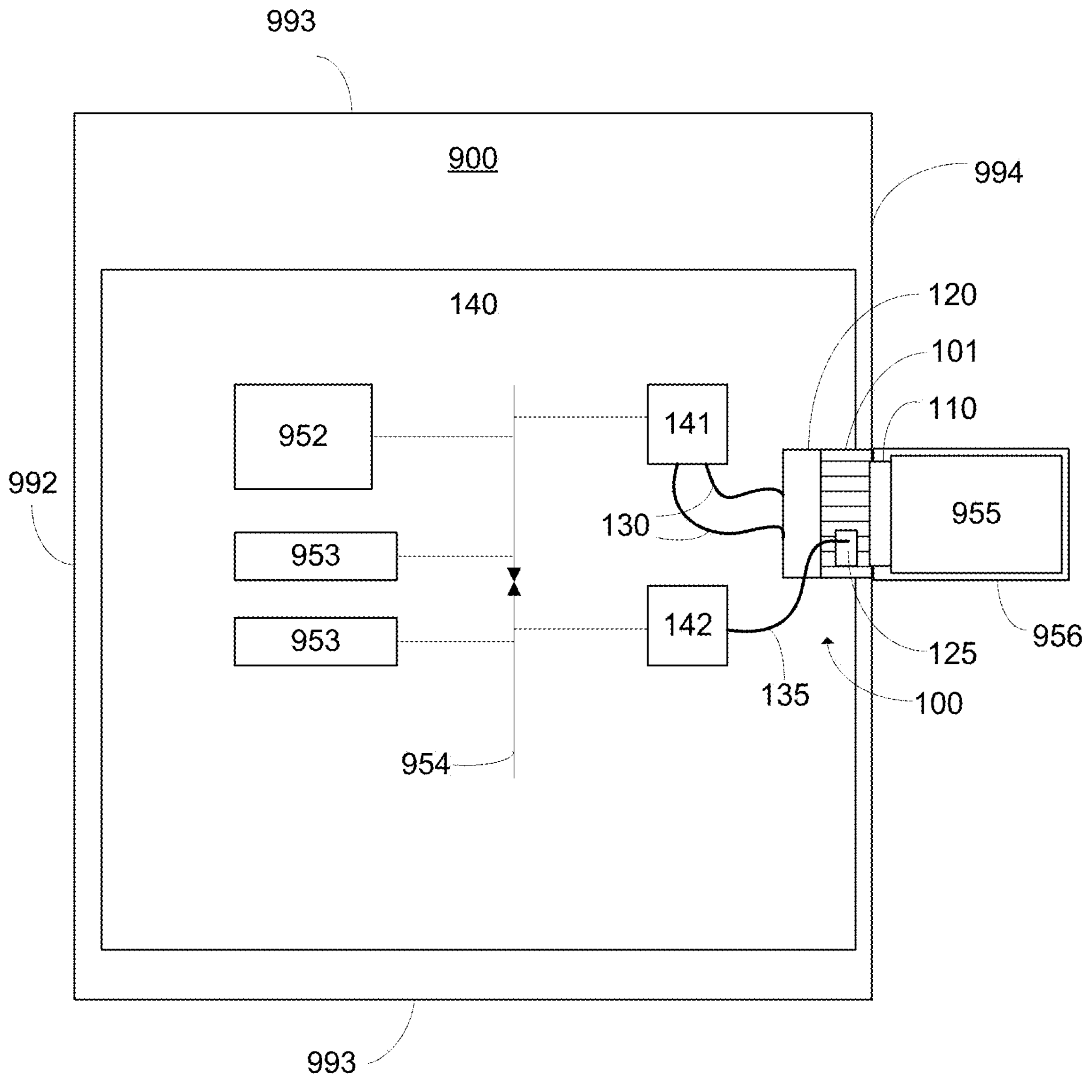
FIG. 9 is a block diagram illustrating an example system with a power supply unit connected to a power supply adapter.

Now referring to FIG. 9, a computing system 900 is presented. In instances, computing device 900 includes a chassis. A "chassis," as used herein, is an enclosure designed to house and support hardware components. The chassis includes a front panel 992, side panels 993 and a rear panel 994. The chassis also includes bottom and top panel, which are omitted for illustrative purposes.

In instances, computing device 900 includes the system board 140. In some instances, computing system 950 may include a processor 952 mounted to system board 140. As used herein, a "processor" is a component configured for executing instructions, performing calculations and managing tasks. In instances, computing system 950 may include two or more processors 952 mounted to system board 140. In an example, without limitations, processor 952 may be a Central Processing Unit, (CPU).

Still referring to FIG. 9, in instances, computing system 900 includes at least a memory 953 mounted to system board 140. As used in this disclosure, a "memory" is a data storage component configured to store instructions for a computing component, such as processor 952. In examples, without limitations, memory 953 may be configured for temporary storage of data, such as a random-access memory (RAM), or permanent data storage, such as Solid-State drives (SSD).

In instances, continuing to refer to FIG. 9, processor 952 and/or memory 953 may communicate with each other via a bus 954. A "bus," as used herein, is a component configured for transmitting data. Bus 954 may include multiple types of bus structures, and combinations thereof, such as memory bus, memory controller, peripheral bus, local bus, and the like.

In instances, computing system 900 includes board power socket 141 as part of primary system board 140. In instances, board power socket 141 is configured to be removably attached to a second connector 132 (not shown in FIG. 9) of power cable 130. Board power socket 141 is configured to be electrically connected to output connector 120 using power cables 130. As described throughout this disclosure, a first connector 131 (now shown) is used to removably attach power cable 130 to output connector 120. Although only one board power socket 141 is illustrated in FIG. 9, other examples may include a plurality of board power sockets 141.

In some instances, computing system 900 includes board sideband socket 142 as a part of primary system board 140. In some instances, board sideband socket 142 is configured to be connected to a sideband outlet 125 using sideband cable 135. As described in this disclosure, sideband cable 135 includes two ends configured to removably attach to board sideband socket 142 at one end and sideband outlet 125 at the other.

In instances, computing system 900 further includes PSU adapter 100. In instances PSU adapter 100 includes output connector 120. In some instances, PSU adapter 100 may be attached to rear panel 994. In instances, PSU adapter 100 may be attached to a PSU cage 956, which may be attached to rear panel 994. PSU adapter 100 may be fastened to PSU cage 956. PSU cage 956 may include PSU cage 356 described in reference to FIGS. 4A-B. In instances, PSU cage 956 is configured to house a PSU 955. PSU 955 may include PSU 355 described in reference to FIGS. 3 and 4A-B.

In instances, PSU adapter 100 includes PSU connector 101. Output connector 120 may be permanently attached to PSU connector 101. In some instances, output connector 120 may be pressed fitted to PSU connector 101. In some instances, output connector 120 may be removably attached to PSU connector 101. For example, output connector 120 may be removable using a specialized tool. In instances, computing system 900 includes a connection between the primary system board 140 and PSU 955, where the connection includes connecting board power socket 141 to adapter 100 via the output connector 120, using power cable 130, and connecting the PSU 955, through edge connector 110, to adapter 100 via PSU connector 101. In some instances, connection between primary system board 140 and PSU 955 may also include connecting board sideband socket 142 to adapter 100 via the sideband outlet 125 using sideband cable 135.

In instances, a method is presented. The method includes inserting edge connector 110 of a PSU, including one or more pins, into a socket of power supply unit connector 101 of a power supply adapter 100. Inserting edge connector 110 includes moving a first portion and a second portion of first and second conductivity clamps 103/106 away from each other as to provide nan opening for inserting edge connector 110 and moving edge connector 110 towards power supply connector 101 until one or more pins are electrically connected to first and second conductivity clamps 103/106. In instances, the method may further include electrically connecting the one or more pins to sideband contacts 108 of the PSU connector 101.

The method further includes inserting first connector 131 of power cable 130 into output connector 120 of power supply adapter 100, the output connector 120 being electrically connected to ground and primary conductor assemblies 102/105, and further includes inserting second connector 132 of power cable 130 into board power socket 141 of primary system board. In instances, the method may further include inserting a first end of sideband cable 135 to sideband outlet 125, the sideband outlet being communicatively connected to sideband contacts 108, and inserting a second end of sideband cable 135 into board sideband socket 142.

In instances, the method may include inserting a first end of inter-adapter cable 236 into ground and power groups 124*a*/124*b* of output connector 120 and into ground and power groups 224*a*/224*b* of secondary output connector 220. In some instances the method may include inserting first connector 131 of power cable 130 to a second group 123 of output connector 120 and to a first group 222 of secondary output connector 220.

In the description above, various types of electronic circuitry are described. As used herein, "electronic" is intended to be understood broadly to include all types of circuitry utilizing electricity, including digital and analog circuitry, direct current (DC) and alternating current (AC) circuitry, and circuitry for converting electricity into another form of energy and circuitry for using electricity to perform other functions. In other words, as used herein there is no distinction between "electronic" circuitry and "electrical" circuitry.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. A power supply adapter comprising:

a casing;

a power supply unit (PSU) connector comprising a socket configured of receive an edge connector of a PSU;

an output connector configured to receive a first connector of a power cable and comprising connector pins;

wherein the PSU connector comprises:

a ground conductor assembly housed in the casing and comprising:

a first plate assembly in contact with a first group of the connector pins; and a first conductivity clamp comprising a set of ground contacts electrically connected to the first plate assembly and configured to engage ground pins of the edge connector;

a primary conductor assembly housed in the casing and comprising:

a second plate assembly in contact with a second group of the connector pins; and a second conductivity clamp comprising a set of primary contacts electrically connected to the second plate assembly and configured to engage primary power pins of the edge connector.

2. The adapter of claim 1, wherein each of the connector pins of the output connector comprises a first portion which is in contact with a plate of the first plate assembly or a plate of the second plate assembly and a second portion which is configured to removably engage with a corresponding pin of the first connector of the power cable in a mated state of the first connector with the output connector.

3. A system comprising the adapter of claim 2 and the power cable, wherein the power cable comprises a second connector and wires connecting the first connector to the second connector, wherein the second connector is configured to be mated with a board power socket of a primary system board.

4. The system of claim 3, wherein the board power socket comprises a PICPWR distribution connector.

5. The system of claim 3, wherein the first connector of the power cable is electrically connected to a third connector configured to mate with a second power supply adapter.

6. The adapter of claim 1, wherein the PSU connector comprises sideband contacts in the socket configured to engage with sideband pins of the edge connector.

7. The adapter of claim 6, wherein the adapter comprises a sideband outlet communicably connected to the sideband contacts and configured to mate with a connector of a sideband cable configured to connect to a board sideband socket of a primary system board.

8. The adapter of claim 2, wherein the casing comprises attachment features configured to engage with a PSU cage housing the power supply unit to attach the adapter to the PSU cage.

9. The adapter of claim 1, wherein the first and second set of conductivity clamps comprises a sloped tip configured to contact the edge connector and open the conductivity clamps in response to the edge connector being inserted into the socket.

10. The adapter of claim 1, wherein the power supply connector and the output connector are on opposite sides of each other, wherein the power connector and the output connector horizontally overlap.

11. The adapter of claim 1, wherein the connector pins are press fitted into the first and second plate assembly.

12. The adapter of claim 1, wherein the power supply unit connector and the casing are integrally attached.

13. The adapter of claim 1, wherein the output connector comprises one or more connector housings configured to removably attach to the casing.

14. The adapter of claim 1, wherein the output connector comprises one or more connector housings integrally attached to the casing.

15. A computing system, comprising:

a chassis comprising a base and a back panel;

a system board supported by the base, wherein the system board comprises one or more power sockets;

a power supply unit (PSU) supported by the chassis and comprising an edge connector;

a power cable comprising a first connector, a second connector, and wires extending between the first and second connectors, wherein the second connector is mated with one of the power sockets;

a power supply adapter comprising:

a casing;

an output connector connected to the casing, wherein the output connector comprises connector pins and is mated with the first connector of the power cable; and a power supply unit (PSU) connector connected to the casing, wherein the PSU connector comprises:

a socket into which the edge connector extends;

a ground conductor assembly housed in the casing and electrically connected to a first group of the connector pins and to ground pins of the edge connector; and a primary conductor assembly housed in the casing and electrically connected to a second group of the connector pins and to primary power pins of the edge connector.

16. The system of claim 11, further comprising a cage housing the power supply unit, wherein the power supply adapter is attached to the cage.

17. The system of claim 11, comprising a sideband cable connected to the primary system board, wherein the PSU connector comprises sideband contacts engaged with sideband pins of the edge connector, wherein the adapter comprises a sideband connector electrically connected to the sideband contacts and mated with a connector of the sideband cable.

18. The system of claim 11, wherein the one or more power sockets comprise a PICPWR distribution connector.

19. A method comprising:

inserting an edge connector of a power supply unit, comprising one or more pins, into a socket of a PSU connector of a power supply adapter, wherein inserting comprises:

moving a first portion and a second portion of sets of conductivity clamps away from each other as to provide an opening for inserting the edge connector; and moving the edge connector towards the power supply connector until the one or more pins are electrically connected to the sets of conductivity clamps;

inserting a first connector of a power cable into an output connector of the power supply adapter, the output connector being electrically connected to the sets of conductivity clamps of the PSU connector; and inserting a second connector of the power cable into a power socket of a system board.

20. The method of claim 19, further comprising inserting a first end of a sideband cable into a sideband connector of the power supply adapter.

* * * * *